(12) United States Patent
Lee

(10) Patent No.: US 10,950,642 B2
(45) Date of Patent: Mar. 16, 2021

(54) IMAGE SENSOR INCLUDING PARTITION PATTERNS

(71) Applicant: SK hynix Inc., Icheon-si (KR)

(72) Inventor: Kyoung-In Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/219,680

(22) Filed: Dec. 13, 2018

(65) Prior Publication Data
US 2019/0267420 A1 Aug. 29, 2019

(30) Foreign Application Priority Data
Feb. 26, 2018 (KR) .......................... 10-2018-0022688

(51) Int. Cl.
*H01L 27/146* (2006.01)
*H04N 5/3745* (2011.01)

(52) U.S. Cl.
CPC .. *H01L 27/14621* (2013.01); *H01L 27/14603* (2013.01); *H01L 27/14623* (2013.01);
(Continued)

(58) Field of Classification Search
CPC ......... H01L 27/14621; H01L 27/14627; H01L 27/14645; H01L 27/14603;
(Continued)

(56) References Cited

U.S. PATENT DOCUMENTS 6,473,238 B1 * 10/2002 Daniell ................ G02B 3/0068
359/622
7,598,554 B2 10/2009 Kim
(Continued)

FOREIGN PATENT DOCUMENTS

KR 10-2001-0061341 A 7/2001

*Primary Examiner* — Alexander O Williams
(74) *Attorney, Agent, or Firm* — Perkins Coie LLP

(57) ABSTRACT

An image sensor image sensor may include: a substrate; photo-sensing elements formed in the substrate, each photo-sensing element responsive to light to produce a photo-sensing electrical signal; an antireflection layer formed over of the photo-sensing elements and structured to reduce optical reflection to facilitate optical transmission of incident light to the photo-sensing elements through the antireflection layer; color filters formed over the antireflection layer and arranged to spatially correspond to the photo-sensing elements, respectively, each color filter structured to select a designated color in the incident light to transmit through to a corresponding photo-sensing element; and partition patterns formed over the antireflection layer and arranged to spatially correspond to the photo-sensing elements, respectively, to partition light receiving area above the photo-sensing elements into separate light receiving areas, each partition pattern surrounding a corresponding color filter to be separate from an adjacent color filter; grooves formed in upper portions of the partition patterns, and providing air gaps between the adjacent partition patterns; micro lenses formed over the partition patterns and the color filters to direct incident light to the photo-sensing elements through the color filters, respectively. The micro lenses may be separated from one another by the grooves.

13 Claims, 18 Drawing Sheets

(52) U.S. Cl.
CPC .. *H01L 27/14627* (2013.01); *H01L 27/14645* (2013.01); *H04N 5/37455* (2013.01)

(58) Field of Classification Search
CPC ............ H01L 27/14634; H01L 27/146; H04N 5/3745; H04N 5/37455
USPC ....................................................... 257/432
See application file for complete search history.

(56) References Cited

U.S. PATENT DOCUMENTS

| | | | | |
|---|---|---|---|---|
| 8,119,439 B2* | 2/2012 | Park | ................. | H01L 27/14645 438/72 |
| 2006/0249765 A1* | 11/2006 | Hsieh | ................. | H01L 27/14632 257/292 |
| 2008/0291303 A1* | 11/2008 | Onozawa | ............. | H04N 5/2254 348/294 |
| 2010/0201834 A1* | 8/2010 | Maruyama | ........ | H01L 27/14636 348/222.1 |
| 2012/0267743 A1* | 10/2012 | Nakamura | ........ | H01L 27/14621 257/432 |
| 2013/0293751 A1* | 11/2013 | Vaartstra | ................. | H01L 31/18 348/280 |
| 2014/0264686 A1* | 9/2014 | Tu | ..................... | H01L 27/14623 257/432 |
| 2014/0299958 A1* | 10/2014 | Kokumai | .......... | H01L 27/14689 257/446 |
| 2014/0367817 A1* | 12/2014 | Furuta | ................. | H01L 27/1464 257/432 |
| 2015/0123227 A1 | 5/2015 | Ootsuka et al. | | |
| 2016/0027822 A1 | 1/2016 | Ooka et al. | | |
| 2016/0211294 A1* | 7/2016 | Lin | ................... | H01L 27/14621 |
| 2016/0301897 A1* | 10/2016 | Huang | ............. | H01L 27/14623 |
| 2017/0221943 A1* | 8/2017 | Yamazaki | ......... | H01L 27/14616 |
| 2017/0287955 A1* | 10/2017 | Ukigaya | ................ | H04N 5/378 |
| 2017/0330905 A1* | 11/2017 | Tak | .................... | H01L 27/14621 |
| 2018/0219040 A1* | 8/2018 | Choi | ................. | H01L 27/14645 |
| 2018/0286904 A1* | 10/2018 | Tazoe | ................ | H01L 27/14621 |
| 2018/0356575 A1* | 12/2018 | Takahashi | ............. | G02B 5/206 |
| 2019/0123083 A1* | 4/2019 | Borthakur | ......... | H01L 27/14685 |
| 2019/0296075 A1* | 9/2019 | Oh | ....................... | H04N 5/3765 |
| 2019/0319060 A1* | 10/2019 | Do | .................... | H01L 27/14621 |

* cited by examiner

IMAGE SENSOR INCLUDING PARTITION PATTERNS

CROSS-REFERENCE TO RELATED APPLICATION

This patent document claims priority under 35 U.S.C. § 119 to Korean Patent Application No. 10-2018-0022688 filed on Feb. 26, 2018, which is incorporated herein by reference in its entirety.

TECHNICAL FIELD

The technology and implementations disclosed in this patent document generally relate to an image sensor, a method for forming the image sensor, and an electronic device including the image sensor.

BACKGROUND

Recently, with the development of information and communication technologies and the digitalization of image information, an increasing number of electrical devices, such as a digital camera, a camcorder, a mobile phone, a personal communication system (PCS), a game machine, a security camera and a medical micro camera, are now equipped with image sensors. An image sensor includes a plurality of pixels, and each of the plurality of pixels includes a photodiode, a color filter and a micro lens. In general, the plurality of pixels includes grid patterns for optically isolating the pixels. However, since the grid patterns alone cannot sufficiently guide light, it is difficult to sufficiently improve quantum efficiency and a crosstalk phenomenon.

SUMMARY

This patent document provides, among others, designs of image sensors that include partition patterns to improve quantum efficiency and a crosstalk phenomenon.

Also, various embodiments are directed to a method for forming the image sensor including partition patterns.

Further, various embodiments are directed to an electronic device including the image sensor including partition patterns.

In an embodiment of the disclosed technology, an image sensor may include: a substrate; photo-sensing elements formed in the substrate, each photo-sensing element responsive to light to produce a photo-sensing electrical signal; an antireflection layer formed over of the photo-sensing elements and structured to reduce optical reflection to facilitate optical transmission of incident light to the photo-sensing elements through the antireflection layer; color filters formed over the antireflection layer and arranged to spatially correspond to the photo-sensing elements, respectively, each color filter structured to select a designated color in the incident light to transmit through to a corresponding photo-sensing element; and partition patterns formed over the antireflection layer and arranged to spatially correspond to the photo-sensing elements, respectively, to partition light receiving area above the photo-sensing elements into separate light receiving areas, each partition pattern surrounding a corresponding color filter to be separate from an adjacent color filter; grooves formed in upper portions of the partition patterns, and providing air gaps between the adjacent partition patterns; micro lenses formed over the partition patterns and the color filters to direct incident light to the photo-sensing elements through the color filters, respectively. The micro lenses may be separated from one another by the grooves.

In another aspect, an image sensor is provided to comprise: a substrate having photodiodes; an antireflection layer over a first surface of the substrate; partition patterns over the antireflection layer; grooves formed in upper portions of the partition patterns, and providing air gaps; color filters between the partition patterns; and micro lenses over the color filters, wherein the micro lenses are physically separated from one another by the grooves.

In some implementations, lower ends of the grooves are recessed to be lower than top surfaces of the color filters. In some implementations, the partition patterns and the grooves are arranged in a mesh form which overlap with each other in a top view. In some implementations, the image sensor further comprises: flare prevention layers conformally formed on surfaces of the micro lenses to reduce flare and extended to fill the grooves. In some implementations, the image sensor further comprises: optically transparent layers conformally formed on surfaces of the micro lenses to reduce flare and extended to fill the grooves. In some implementations, the partition patterns include a polymeric organic material or an inorganic material which has a refractive index lower than the color filters. In some implementations, the micro lenses have a refractive index lower than the color filters. In some implementations, the partition patterns have a refractive index lower than the micro lenses. In some implementations, the partition patterns and the micro lenses include a same material. In some implementations, top surfaces of the partition patterns are positioned at a level higher than top surfaces of the color filters. In some implementations, the image sensor further comprises: grid patterns disposed between the antireflection layer and the partition patterns, wherein the grid patterns include a metal. In some implementations, the grid patterns, the partition patterns and the grooves are arranged in a mesh form which overlap with one another in a top view. In some implementations, the partition patterns have a horizontal width greater than that of the grid patterns to surround side surfaces of the grid patterns. In some implementations, the partition patterns include lower portions which have a relatively small horizontal width and upper portions which have a relatively large horizontal width. In some implementations, the width of the lower portions of the partition patterns is smaller than a width of the grid patterns.

In an embodiment, an image sensor may include: a substrate; photo-sensing elements disposed in the substrate to convert light into photo-sensing signals representing an image; an antireflection layer disposed over the substrate to reduce optical reflection of incident light; partition patterns disposed over the antireflection layer; color filters disposed between the partition patterns to select desired colors in the incident light to pass through the color filters for image sensing; micro lenses disposed over the color filters to direct incident light through the color filters to reach the photo-sensing elements; and flare prevention layers that are optically transparent and are formed over surfaces of the micro lenses to reduce flare. The partition patterns have a refractive index lower than the color filters.

In another aspect, an image sensor is provided to comprise: a substrate having photodiodes; an antireflection layer over a first surface of the substrate; partition patterns over the antireflection layer; color filters between the partition patterns; micro lenses over the color filters; and flare prevention layers over surfaces of the micro lenses, wherein the partition patterns have a refractive index lower than the color filters.

In some implementations, the image sensor further comprises: grooves formed in upper portions of the partition patterns, and providing air gaps, wherein the micro lenses are physically separated from one another, and arranged in a matrix shape having rows and columns, the micro lenses having island shapes in a top view. In some implementations, lower ends of the grooves are recessed to be lower than top surfaces of the color filters. In some implementations, the image sensor further comprises: grid patterns formed between the antireflection layer and the partition patterns, and vertically overlapping with the partition patterns, wherein the partition patterns include a polymeric organic material or an inorganic material, and wherein the grid patterns include a metal. In some implementations, the partition patterns include a polymeric organic material or an inorganic material which has a refractive index lower than the color filters. In some implementations, the partition patterns have a refractive index lower than the micro lenses.

According to the embodiments, since color filters and micro lenses may be further isolated optically and physically, a more efficient light guiding effect may be achieved.

According to the embodiments, since a light guiding effect is improved, a crosstalk phenomenon and an RAR (ray angle response) may be improved.

According to the embodiments, since light shift decreases, a shading effect may be improved.

According to the embodiments, a quantum efficiency loss in fine pixels may be reduced, and, since the horizontal with of grid patterns may be increased, the diffraction phenomenon of light may be eliminated or mitigated.

According to the embodiments, since the light guiding effect is improved, a half shield phase difference detection auto-focus function may be implemented.

According to the embodiments, since the refractive index of micro lenses may be adjusted, the focal length of the micro lenses may also be adjusted.

Other advantages according to various embodiments of the present disclosure have been described in the text.

DETAILED DESCRIPTION

Figure 1:
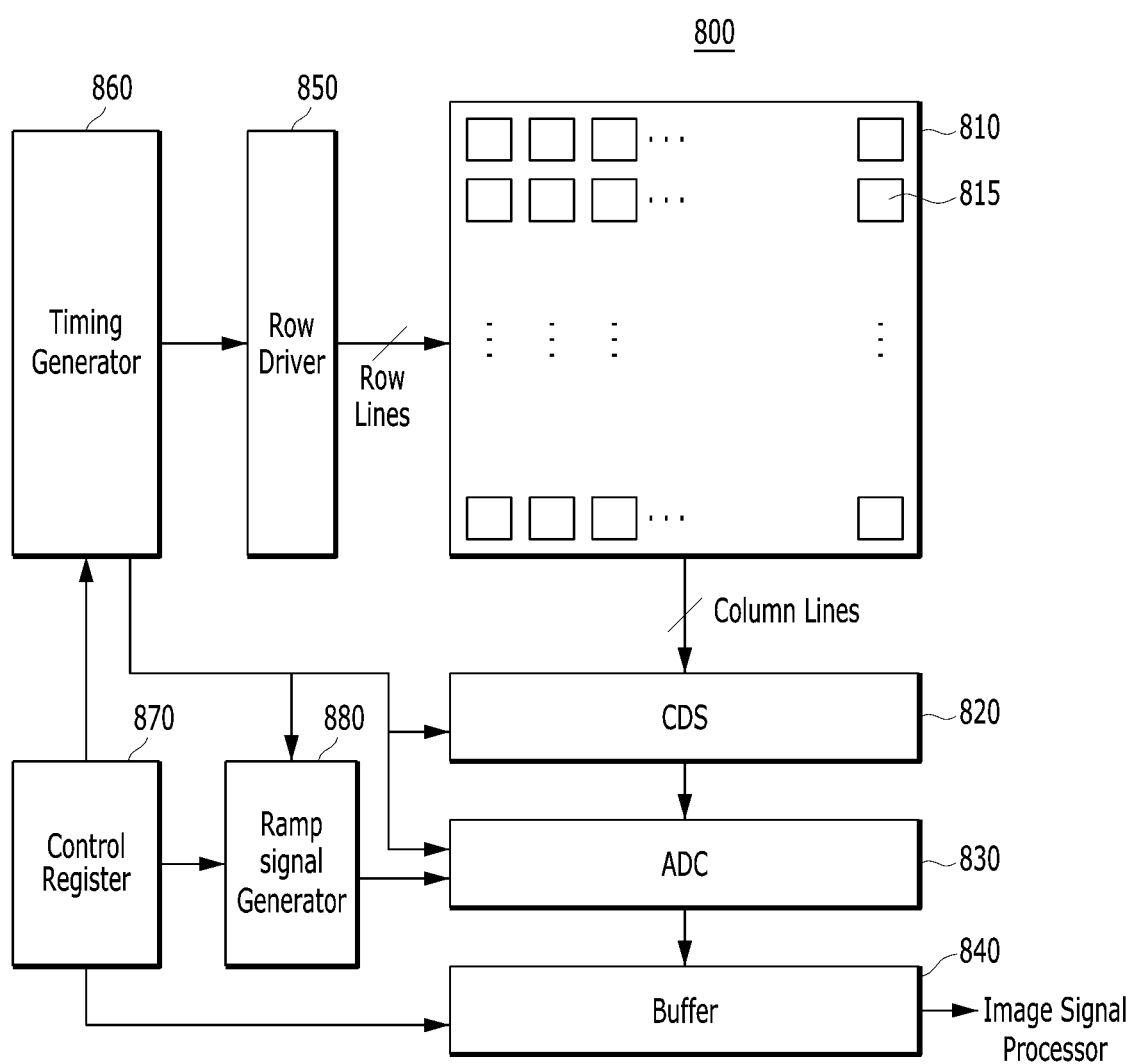
FIG. 1 is an example of a schematic block diagram illustrating an image sensor based on an embodiment of the disclosed technology.

The disclosed technology can be implemented to provide an image sensor, a method for forming the image sensor, and an electronic device including the image sensor. The disclosed image sensor suggests a design which allows micro lenses to be optically and physically separated from one another. The disclosed image sensor can also be utilized to optically and physically separate color filters. By the suggested design, a more efficient light guiding effect can be achieved, which further improves a crosstalk phenomenon and an RAR (ray angle response).

In the present disclosure, advantages, features and methods for achieving them will become more apparent after a reading of the following exemplary embodiments taken in conjunction with the drawings. Throughout the disclosure, like reference numerals refer to like parts throughout the various figures and embodiments of the disclosed technology.

Terms used in this specification are used for describing various embodiments, and do not limit the disclosed technology. As used herein, a singular form is intended to include plural forms as well, unless the context clearly indicates otherwise. It will be further understood that the terms "include" and/or "including," when used in this specification, specify the presence of at least one stated feature, step, operation, and/or element, but do not preclude the presence or addition of one or more other features, steps, operations, and/or elements thereof.

FIG. 1 is an exemplary block diagram schematically illustrating an image sensor 800 based on an embodiment of the disclosed technology. Referring to FIG. 1, the image sensor 800 may include a pixel array 810 in which a plurality of pixels is arranged in a matrix structure, e.g., an array of pixels arranged in rows and columns, a correlated double sampler (CDS) 820, an analog-digital converter (ADC) 830, a buffer 840, a row driver 850, a timing generator 860, a control register 870, and a ramp signal generator 880.

The pixel array 810 may include a plurality of pixel blocks 815 which are arranged in a matrix structure including rows and columns. In response to a reception of an incident light, each of the plurality of pixel blocks 815 may convert an optical image information on the received incident light into an electrical image signal, and transmit the electrical image signal to the correlated double sampler 820 through a column line. Each of the plurality of pixel blocks 815 may be coupled with one of row lines and one of column lines. A color filter may be arranged on each of pixel blocks in the pixel array 810 such that light of a specific color is input to each pixel. For example, each of the plurality of pixel blocks 815 may include three different color patterns such that a red color pattern, a green color pattern and a blue color pattern are arranged in the form of a matrix including rows and columns.

The correlated double sampler 820 may hold and sample the electrical image signals which are received from the pixel blocks 815 of the pixel array 810. For example, the correlated double sampler 820 may sample a reference voltage level and the voltage level of a received electrical image signal according to a clock signal provided from the timing generator 860, and transmit an analog signal corresponding to the difference therebetween to the analog-digital converter 830.

The analog-digital converter 830 may convert the received analog signal into a digital signal, and transmit the digital signal to the buffer 840.

The buffer 840 may store or latch the received digital signal and successively output the latched digital signal to an external image signal processor. The buffer 840 may include a memory to store or latch a digital signal and a sense amplifier for amplifying the digital signal.

The row driver 850 may drive the plurality of pixel blocks 815 of the pixel array 810 according to a signal of the timing generator 860. For example, the row driver 850 may generate select signals each for selecting one of the plurality of row lines and/or driving signals each for driving one of the plurality of row lines.

The timing generator 860 may generate a timing signal for controlling the correlated double sampler 820, the analog-digital converter 830, the row driver 850 and the ramp signal generator 880.

The control register 870 may generate control signals for controlling the buffer 840, the timing generator 860 and the ramp signal generator 880.

The ramp signal generator 880 may generate a ramp signal for controlling an image signal outputted from the buffer 840, according to control of the timing generator 860.

Each pixel block 815 of the image sensor 800 can include a photosensor or photo-sensing element that converts received light into electrical charges, which may be implemented in a suitable configuration, including a photodiode, a photogate, a phototransistor, a photoconductor, or some other photosensitive structure capable of generating photo-generated electrical charges. Each imaging pixel can also include a charge storage region for storing the photo-generated charges, which may be constructed as, for example, a floating diffusion region as disclosed in the examples below. Additional circuitry may be included in each imaging pixel, e.g., a transfer transistor for transferring the photo-generated charges from the photosensor to the storage region and a reset circuitry for resetting the charges in the charge storage region after a readout.

Figure 2A:
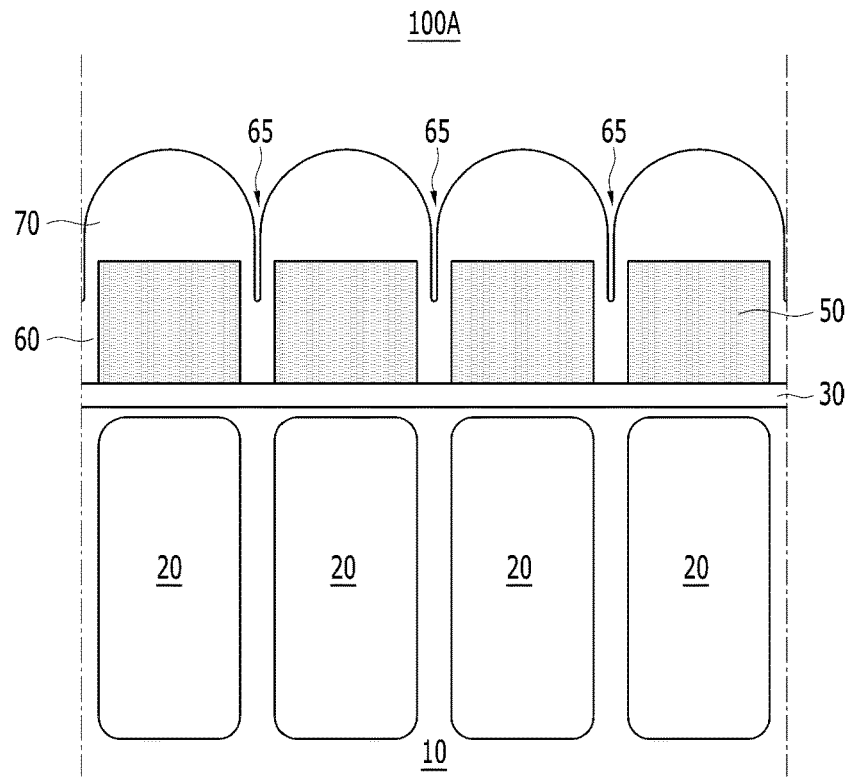
FIGS. 2A to 3H are examples of longitudinal sectional views schematically illustrating an image sensor based on various embodiments of the disclosed technology.

FIGS. 2A to 3H are longitudinal sectional views schematically illustrating image sensors based on various embodiments of the disclosed technology. Referring to FIG. 2A, an image sensor 100A in accordance with an embodiment may include photo-sensing elements such as photodiodes 20 which are formed in a substrate 10, an antireflection layer 30 which is disposed over the first surface, for example, the top surface, of the substrate 10, and color filters 50, partition patterns 60 and micro lenses 70 that are over the antireflection layer 30.

The substrate 10 may include a single crystal silicon wafer, an SOI (silicon-on-insulator) wafer or an epitaxially grown single crystal silicon layer.

The photodiodes 20 may include N-type ions such as phosphorous (P) or arsenic (As) and/or P-type ions such as boron (B) which are implanted into the substrate 10.

The antireflection layer 30 may include an inorganic material layer such as a silicon nitride, a silicon oxide or a silicon oxynitride. The antireflection layer 30 may be formed as a single layer or a multilayer.

The color filters 50 may be separated from one another by the partition patterns 60, and may have island shapes in a top view so that each color filter 50 may be surrounded by a corresponding partition pattern 60. The color filters 50 may be arranged in rows and columns to form a matrix arrangement. Each of the color filters 50 may include the pigment of one among red, green, and blue colors, and a base resin to allow transmission desired colors in red, green, and blue, respectively. One example way of arranging the colors of the color filters 50 may be the well-known Bayer color filter pattern of a repetitive Bayer color filter unit patterns with each unit pattern having 2 green color filter pixels, 1 blue color filter pixel, and 1 red color filter pixel.

The image sensor 100A may include partition patterns 60 formed above the photo-sensing elements such as photodiodes 20 and may be structured to optically and physically isolate or separate the color filters 50 from one another. In this example, the partition patterns 60 may be formed over the antireflection layer 30 and are arranged to spatially correspond to the photo-sensing elements such as the photodiodes 20, respectively, to partition light receiving area above the photo-sensing elements 20 into separate light receiving areas. Each partition pattern 60 surrounds a corresponding color filter 50 to be separate from an adjacent color filter 50. In a top view, the partition patterns 60 may be arranged in a mesh form or a lattice form. The partition patterns 60 may be vertically aligned with the spaces between the photodiodes 20. The partition patterns 60 may be optically transparent to allow optical transmission in the incident light to the underlying color filters and pixels and may include an optically transparent material such as polystyrene, polyimide, polysiloxane, acrylic, epoxy or other polymeric organic materials or an inorganic insulating material such as a silicon oxide.

The micro lenses 70 may be formed and arranged in the form of a hemisphere on or over the color filters 50. The micro lenses 70 may be optically and physically separated from one another and may be spatially arranged to correspond to the photodiodes 20 to direct received light at different locations over the different photodiodes 20 to corresponding photodiodes 20, respectively.

The partition patterns 60 may include grooves 65 which are recessed to be lower than the top surfaces of the color filters 50 such that the grooves 65 may have the mesh form in the upper portions of the partition patterns 60 in a top view. The grooves 65 may provide air gaps in the upper portions of the partition patterns 60. Since the air gaps have a refractive index of about 1.0, the refractive index of the air gaps is lower than that of the partition patterns 60. Therefore, a total reflection may occur at the interface between the air-gap and the partition patterns 60 so that the grooves 65 may efficiently guide light incident through the micro lenses 70 to the photodiodes 20. The micro lenses 70 may be further optically and physically separated from one another by the grooves 65. In addition, the micro lenses 70 may be physically separated from one another by the grooves 65.

In one implementation, the micro lenses 70 may include the same optically transparent material as the optically transparent material used for the partition patterns 60. For example, the micro lenses 70 may be materially continuous with the partition patterns 60 and may be physically integrated with the partition patterns 60.

The partition patterns 60 and the micro lenses 70 may include a polymeric material that is transparent, such as a polystyrene-based resin, a polyimide-based resin, a polysiloxane-based resin, an acrylic-based resin, an epoxy-based resin or a copolymer resin thereof, or a silicon oxide-based or silicon nitride-based inorganic material.

Figure 2B:
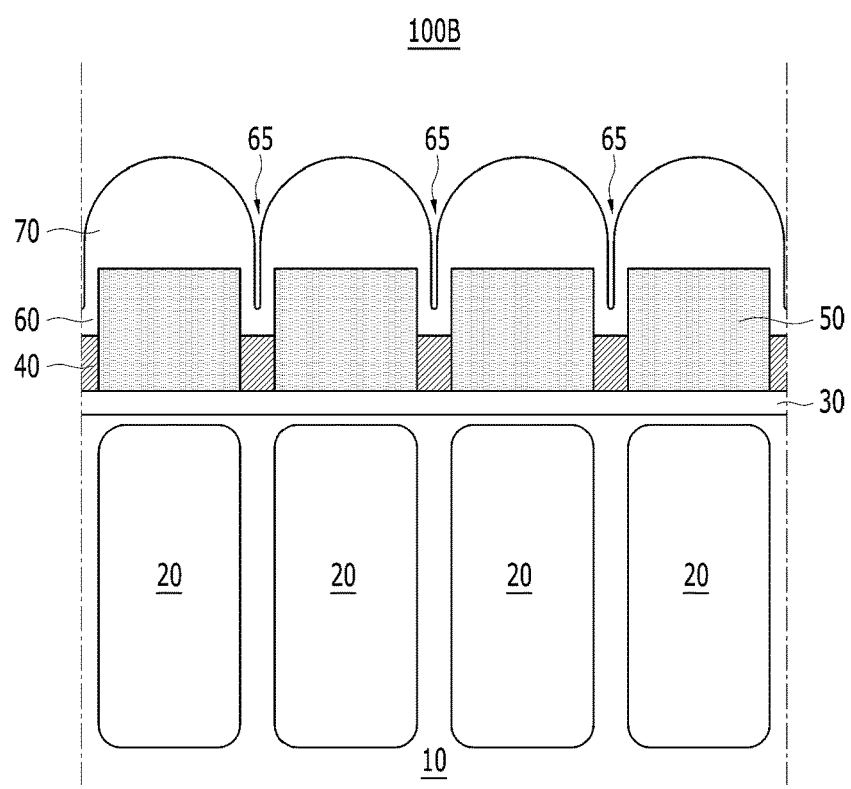

Referring to FIG. 2B, an image sensor 100B based on an embodiment may include photodiodes 20 which are formed in a substrate 10, an antireflection layer 30 disposed over the top surface of the substrate 10, and grid patterns 40, color filters 50, partition patterns 60 and micro lenses 70 that are disposed over the antireflection layer 30. The grid patterns 40 may be structured to be optically opaque to provide optical isolation or separation and may be arranged in the form of a mesh to overlap with the partition patterns 60 in a top view. Therefore, the color filters 50 may be optically and physically separated from each other by the grid patterns 40 and the partition patterns 60. In some implementations, the grid patterns 40 and the partition patterns 60 may be vertically aligned with spaces between the photodiodes 20 and may be located over the spaces between the photodiodes 20. The grid patterns 40 may include an optically opaque material including that is optically absorptive or of a property that otherwise blocks optical transmission, e.g., a metal such as tungsten (W).

Figure 2C:
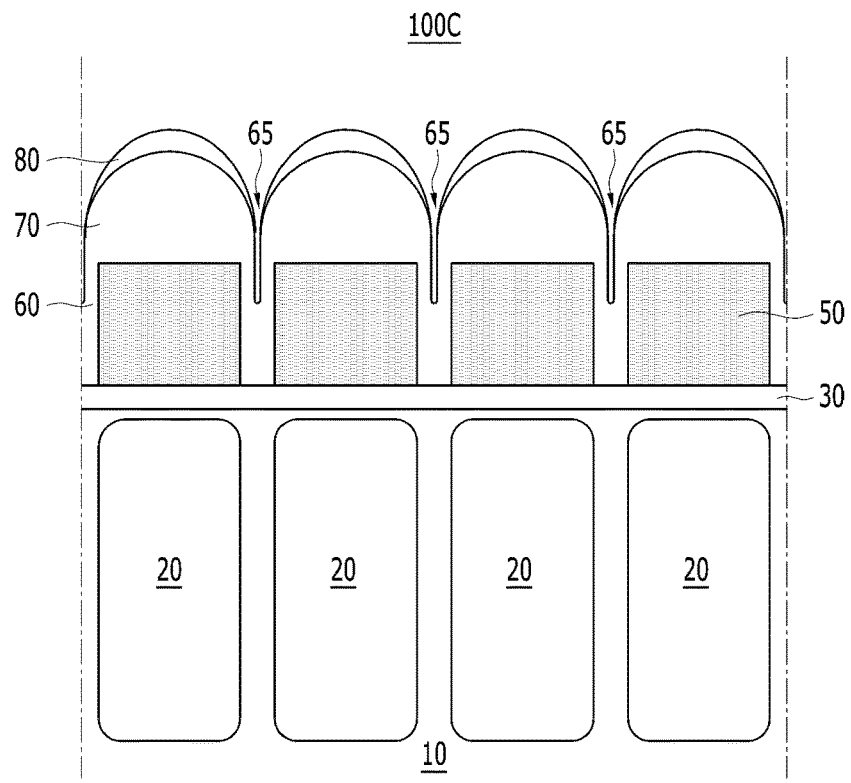

Referring to FIG. 2C, an image sensor 100C based on an embodiment may include photodiodes 20 which are formed in a substrate 10, an antireflection layer 30 disposed over the top surface of the substrate 10, and color filters 50, partition patterns 60, micro lenses 70 and flare prevention layers 80 that are disposed over the antireflection layer 30.

The flare prevention layers 80 may be provided with curved surfaces located above the micro lenses 70 to cause optical refraction on the incident light before the incident light enters respectively micro lenses 70 so as to increase or decrease a focal length in cooperation with the micro lenses 70. The design of the flare prevention layers 80 may be to optically control the final incident light concentration intensity at the photodiodes 20 of the image sensor (e.g., to increase or decrease the light intensity at each photodiode 20) for improving the image resolution according to the degree of integration of the pixels of the image sensor.

In implementations, the flare prevention layers 80 may be formed on the hemispherical surfaces of the micro lenses 70. In some implementations, the flare prevention layers 80 may be conformally formed on entire surfaces of the micro lenses 70. The flare prevention layers 80 may include a silicon oxide. The flare prevention layers 80 may have a refractive index lower than the micro lenses 70. For example, in the case where the micro lenses 70 have a refractive index of about 1.56, the flare prevention layers 80 may have a refractive index of about 1.4. The thickness of the central portions of the flare prevention layers 80 may be thicker than the thickness of the outer portions of the flare prevention layers 80. The flare prevention layers 80 may also be physically separated by the grooves 65. In another embodiment of the disclosed technology, the flare prevention layers 80 may partially or completely fill the insides of the grooves 65. In still another embodiment, the flare prevention layers 80 may fill the insides of the grooves 65 and may not be physically separated from one another.

Figure 2D:
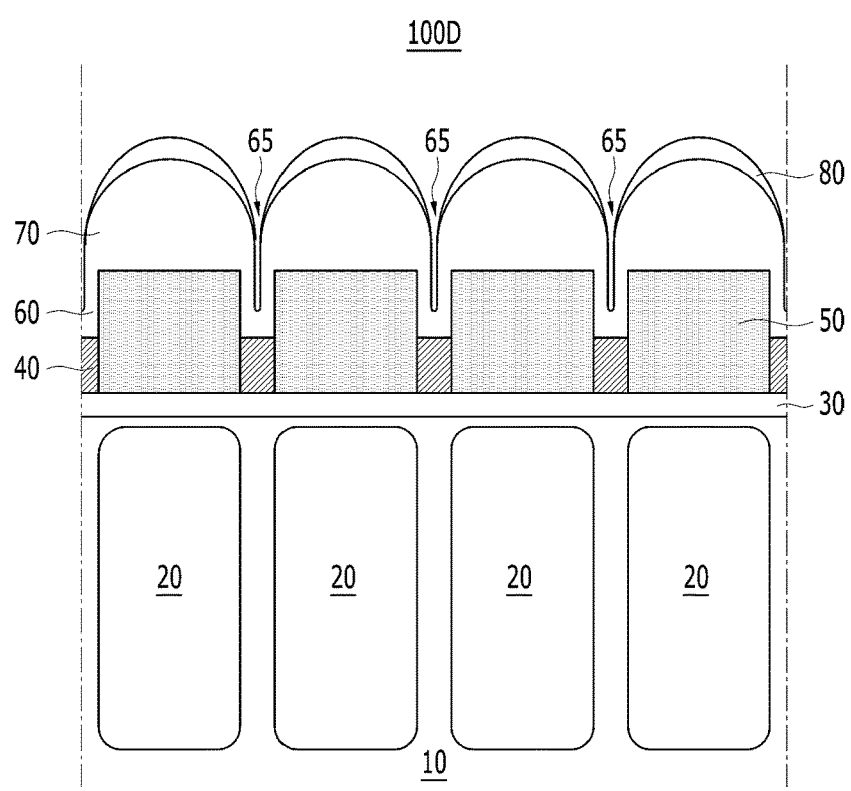

Referring to FIG. 2D, an image sensor 100D based on an embodiment may include photodiodes 20 which are formed in a substrate 10, an antireflection layer 30 disposed over the top surface of the substrate 10, and grid patterns 40, color filters 50, partition patterns 60, micro lenses 70 and flare prevention layers 80 that are disposed on the antireflection layer 30. The image sensor 100D may be understood by referring to the image sensors 100A to 100C shown in FIGS. 2A to 2C. As compared to the image sensor 100C as shown in FIG. 2C, the image sensor 100D may further include the grid patterns 40 including a mesh form. The structures on the grid patterns 40 may be understood based on the descriptions with regard to FIG. 2C.

In the image sensors 100A to 100D shown in FIGS. 2A to 2D, the partition patterns 60 and the micro lenses 70 may be different structures that interface with one another: the partition patterns 60 may be formed to surround and to separate the respectively color filters 50; the micro lenses 70 may be formed on top of the color filters 50 to direct incident light separately into respectively color filters 50. The boundary between a micro lens 70 and its corresponding underlying partition pattern 60 may be a boundary surface defined differently by using the grooves 65 that separate adjacent partition patterns 60 and the micro lenses 70. For example, in an embodiment, the boundary surfaces of the partition patterns 60 and the corresponding micro lenses 70 may be positioned lower than the top surfaces of the color filters 50 where the bottoms of the grooves 65 may be below the top surfaces of the color filters 50. In another embodiment, the boundary surfaces of the partition patterns 60 and the micro lenses 70 may be substantially the same as or similar to the top surfaces of the color filters 50. In still another embodiment, the boundary surfaces of the partition patterns 60 and the micro lenses 70 may be positioned at a level higher than the top surfaces of the color filters 50.

Figure 2E:
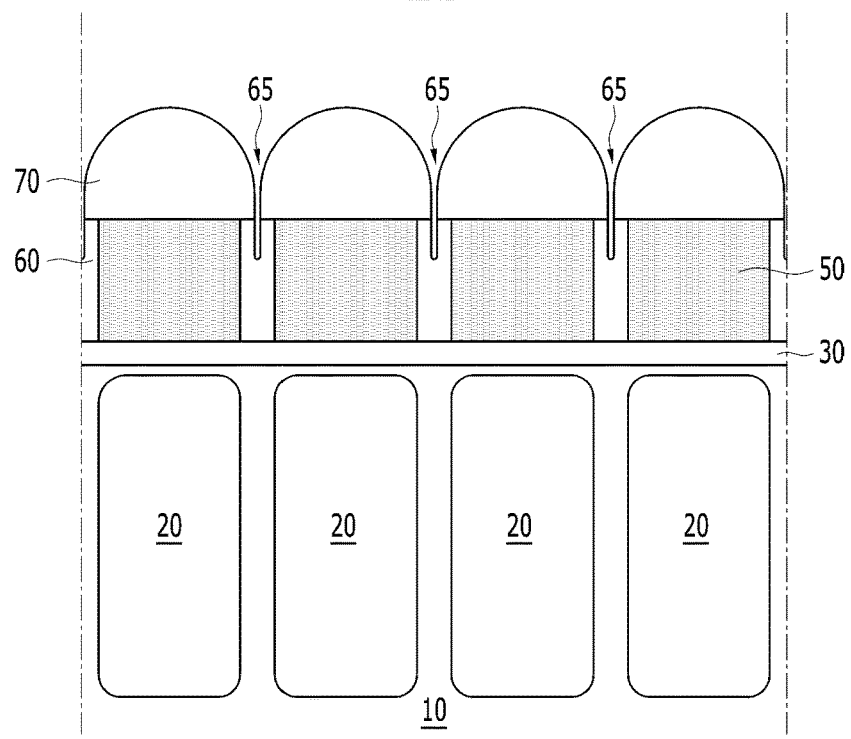

Referring to FIG. 2E, an image sensor 100E based on an embodiment may include photodiodes 20 which are formed in a substrate 10, an antireflection layer 30 disposed over the first surface, for example, the top surface, of the substrate 10, and color filters 50, partition patterns 60 and micro lenses 70 that are disposed over the antireflection layer 30. When compared to the image sensor 100A of FIG. 2A, the partition patterns 60 and the micro lenses 70 may include different materials. That is to say, the partition patterns 60 and the micro lenses 70 may be materially and physically distinguished or separated from each other. The partition patterns 60 may have a refractive index relatively lower than the color filters 50, and the micro lenses 70 may have a refractive index relatively higher than the color filters 50. For example, in the case where the color filters 50 have a refractive index of about 1.4, the partition patterns 60 may have a refractive index of about 1.2. In the present embodiment, the boundary surfaces of the partition patterns 60 and the micro lenses 70 and the top surfaces of the color filters 50 may be positioned at similar levels.

Figure 2F:
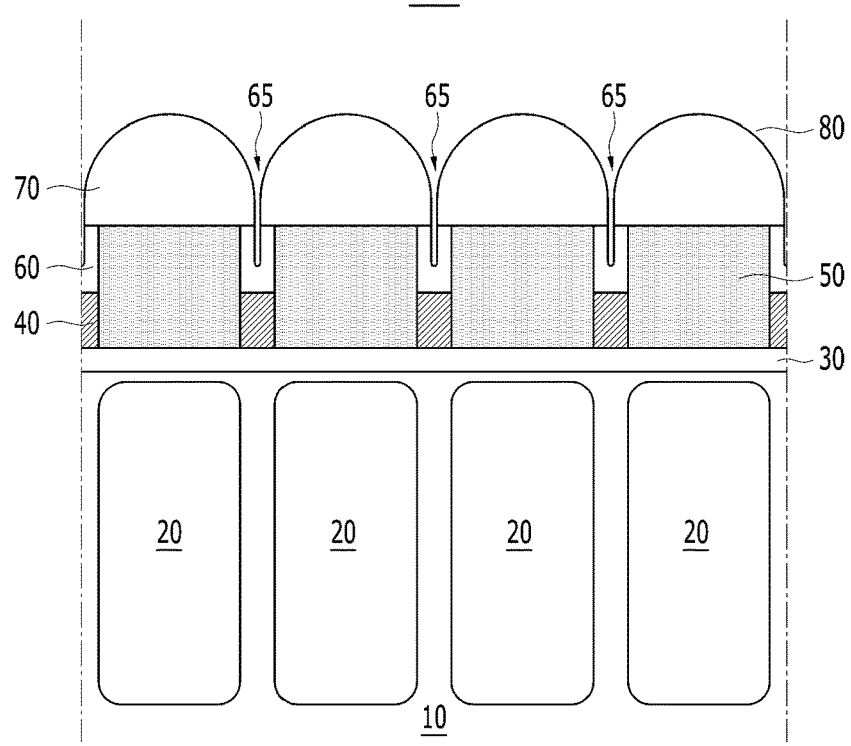

Referring to FIG. 2F, an image sensor 100F based on an embodiment may include photodiodes 20 which are formed in a substrate 10, an antireflection layer 30 disposed over the top surface of the substrate 10, and grid patterns 40, color filters 50, partition patterns 60 and micro lenses 70 that are disposed over the antireflection layer 30. The structures of the image sensor 100F may be understood by referring to the image sensors 100B and 100E of FIGS. 2B and 2E.

Figure 2G:
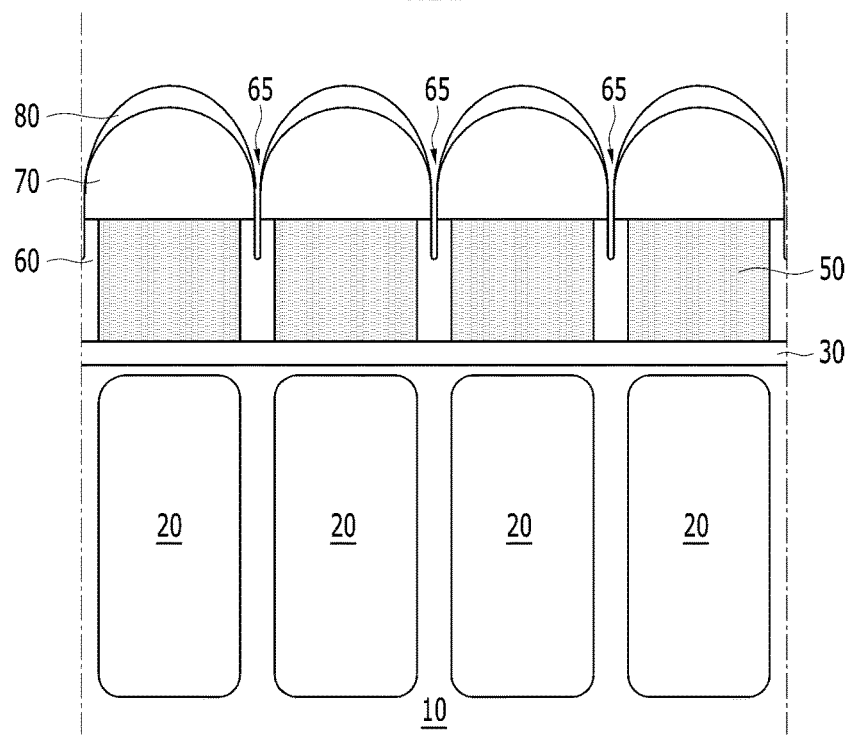

Referring to FIG. 2G, an image sensor 100G based on an embodiment may include photodiodes 20 which are formed in a substrate 10, an antireflection layer 30 disposed over the top surface of the substrate 10, and color filters 50, partition patterns 60, micro lenses 70 and flare prevention layers 80 that are disposed over the antireflection layer 30. The structures of the image sensor 100G may be understood by referring to the image sensors 100C and 100E of FIGS. 2C and 2E.

Figure 2H:
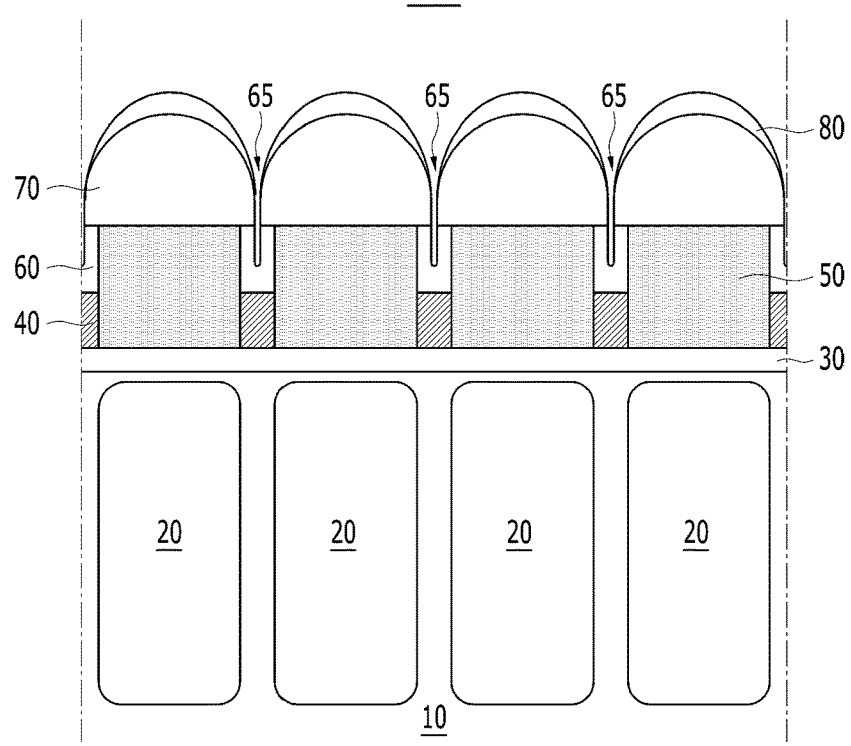

Referring to FIG. 2H, an image sensor 100H based on an embodiment may include photodiodes 20 which are formed in a substrate 10, an antireflection layer 30 disposed over the top surface of the substrate 10, and grid patterns 40, color filters 50, partition patterns 60, micro lenses 70 and flare prevention layers 80 that are disposed over the antireflection layer 30. The image sensor 100H may be understood by referring to the image sensors 100D and 100E of FIGS. 2D and 2E.

Figure 3A:
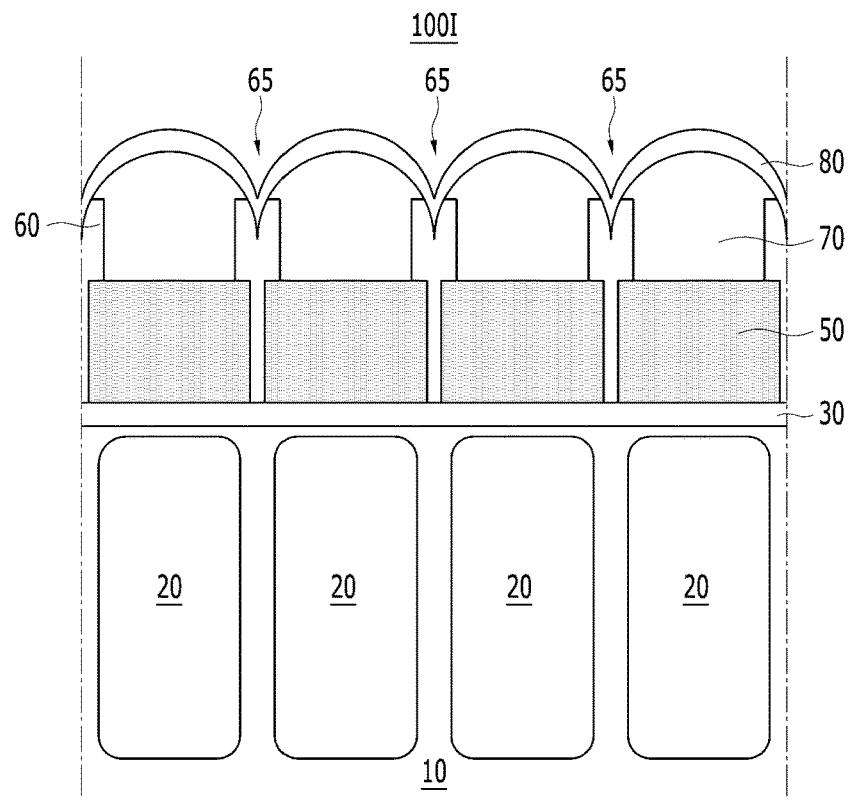

Referring to FIG. 3A, an image sensor 100I based on an embodiment may include photodiodes 20 which are formed in a substrate 10, an antireflection layer 30 disposed over the top surface of the substrate 10, and color filters 50, partition patterns 60, micro lenses 70 and flare prevention layers 80 that are disposed over the antireflection layer 30.

In a top view, the partition patterns 60 may be arranged in the form of a mesh to separate the color filters 50 in island shapes. The partition patterns 60 may have portions disposed over top surfaces of the color filters 50. In the longitudinal sectional view, the partition patterns 60 may have a shape which has a height greater than the vertical thickness of the color filters 50. In some implementations, the partition patterns 60 may have a dam shape. The outer portions of the partition patterns 60 may partially and vertically overlap with the outer portions of the color filters 50. The outer portions of the partition patterns 60 may be disposed over the color filters 50. In some implementations, each of the partition patterns 60 may have an inverted step shape which includes a lower portion having a relatively narrow width and an upper portion having a relatively wide width. The lower portions of the partition patterns 60 may be disposed between side surfaces of the color filters 50. The upper portions of the partition patterns 60 may be disposed over the color filters. The lower portions of the partition patterns 60 may be brought into contact with the side surfaces of the color filters 50. The upper portions of the partition patterns 60 may be disposed on the outer regions of the top surfaces of the color filters 50. The upper portions of the partition patterns 60 may have bottom surfaces which are brought into contact with the top surfaces of the color filters 50.

Grooves 65 may be formed in the upper portions of the partition patterns 60. In the present embodiment, the flare prevention layers 80 may fill the grooves 65 which are formed in the upper portions of the partition patterns 60. Therefore, the flare prevention layers 80 may also have grooves 65.

Figure 3B:
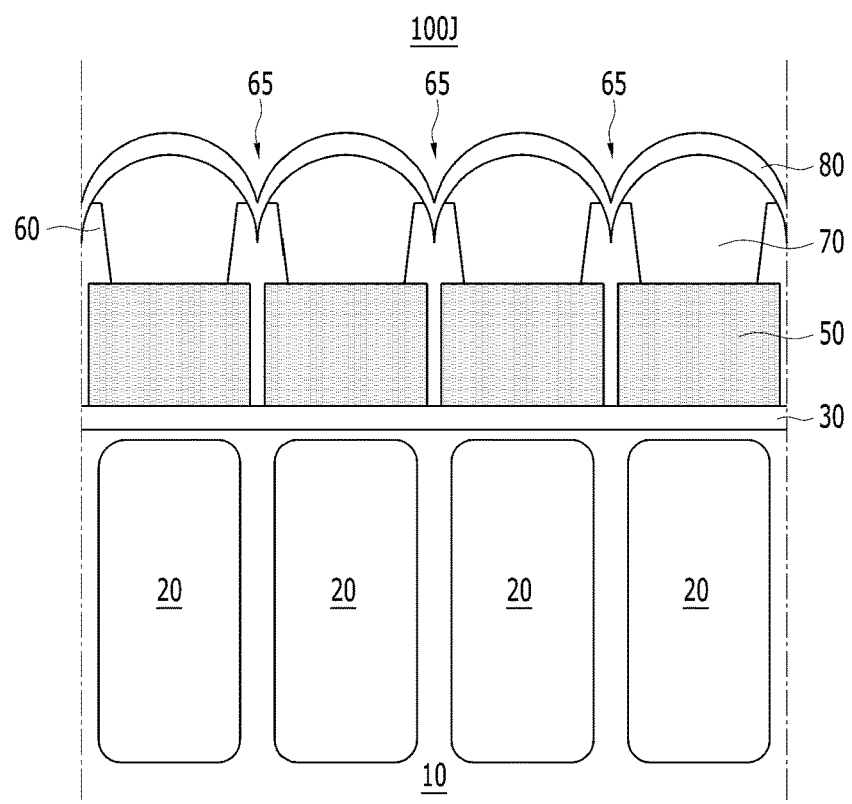

Referring to FIG. 3B, an image sensor 100J based on an embodiment may include partition patterns 60 which have inclined sidewalls, when compared to the image sensor 100I shown in FIG. 3A. The upper portions of the partition patterns 60 have a varying width increasing downward. For example, each of the upper portions of the partition patterns 60 may have an uppermost portion which is relatively narrow in width and a lowermost portion which is relatively wide in width. The sidewalls of the partition patterns 60 may be inclined during a manufacturing process, and the filling characteristic of the micro lenses 70 can be improved due to the inclined partition patterns. The partition patterns 60 of the image sensors 100A to 100H shown in FIGS. 2A to 2H may also have inclined side surfaces. The partition patterns 60 of the image sensor 100J may also have positively (+) inclined side surfaces (forward direction to go up). The color filters 50 of the image sensors 100A to 100H shown in FIGS. 2A to 2H may have negatively (−) inclined side surfaces (backward direction to go up).

Figure 3C:
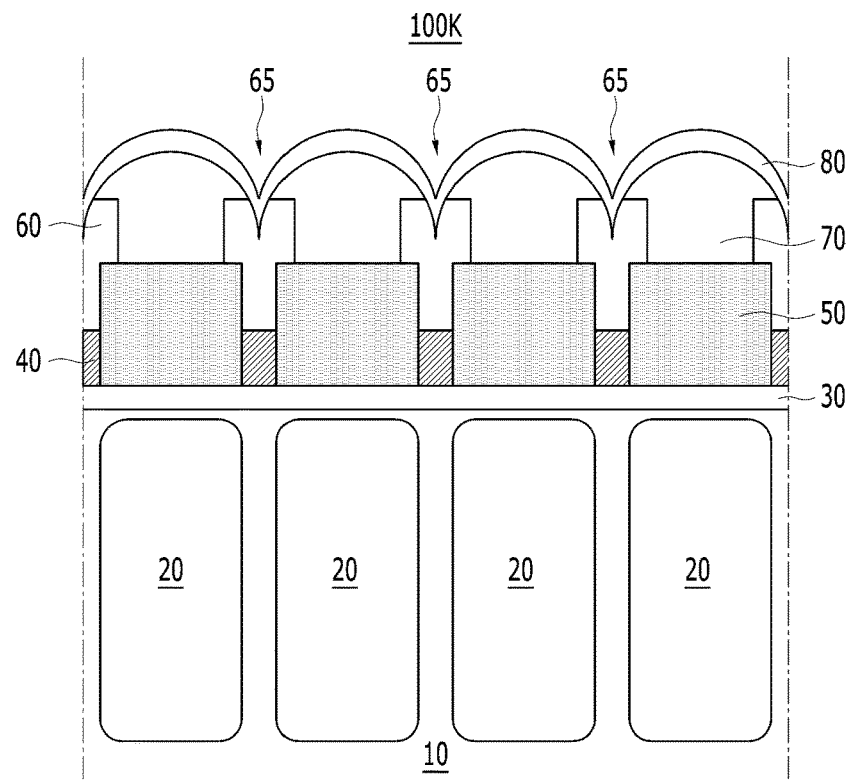

Referring to FIG. 3C, an image sensor 100K based on an embodiment may include photodiodes 20 which are formed in a substrate 10, an antireflection layer 30 disposed over the top surface of the substrate 10, and grid patterns 40, color filters 50, partition patterns 60, micro lenses 70 and flare prevention layers 80 that are disposed over the antireflection layer 30. The partition patterns 60 may be formed on the grid patterns 40 between the color filters 50. For example, the grid patterns 40 and the sidewalls of the lower portions of the partition patterns 60 may be vertically aligned.

Figure 3D:
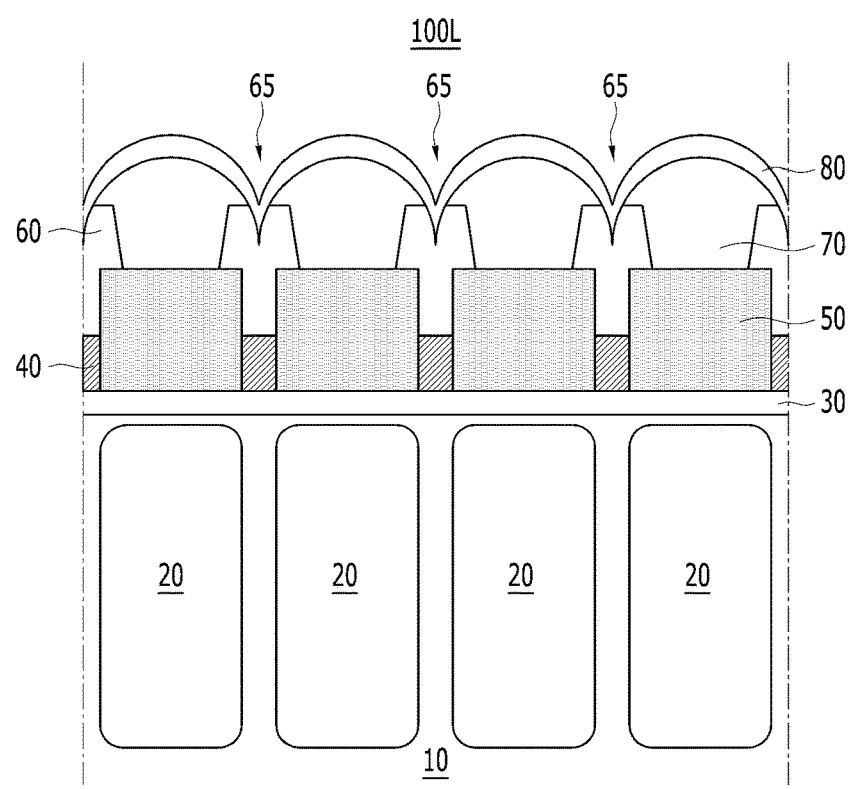

Referring to FIG. 3D, an image sensor 100L based on an embodiment may include partition patterns 60 which have inclined sidewalls, when compared to the image sensor 100K shown in FIG. 3C.

Figure 3E:
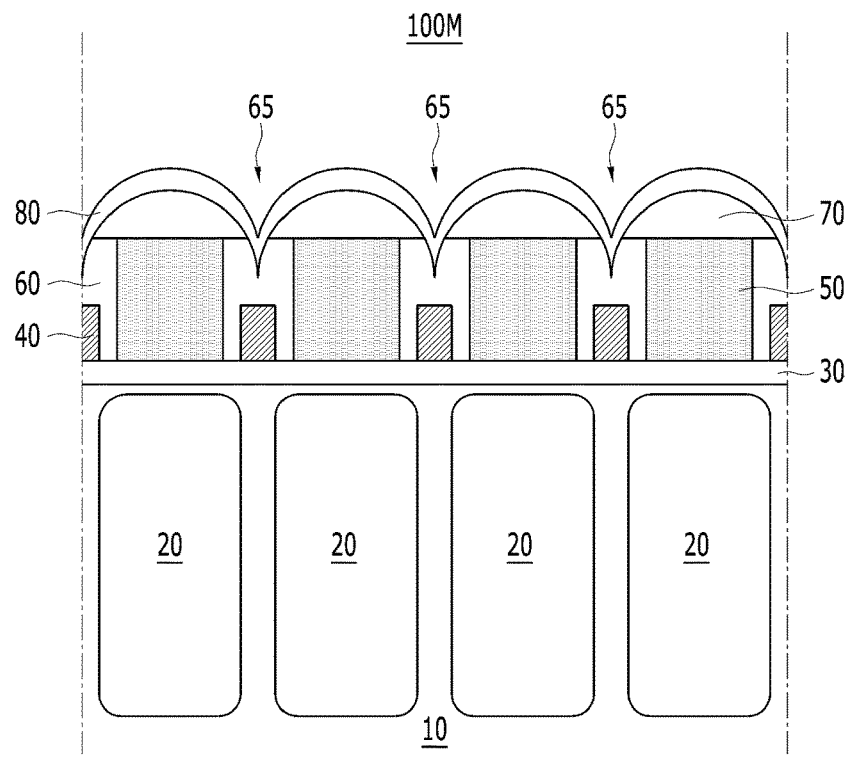

Referring to FIG. 3E, an image sensor 100M based on an embodiment may include photodiodes 20 which are formed in a substrate 10, an antireflection layer 30 disposed over the top surface of the substrate 10, and grid patterns 40, color filters 50, partition patterns 60, micro lenses 70 and flare prevention layers 80 that are disposed over the antireflection layer 30.

Each of the partition patterns 60 may have a horizontal width wider than that of the grid pattern 40 and a vertical thickness (or height) higher than that of the grid pattern 40. The partition patterns 60 may completely cover the grid patterns 40. In some implementations, the partition patterns 60 may surround the sidewalls of the grid patterns 40 and may cover the grid patterns 40 such that the top surfaces of the grid patterns 40 may be not exposed. The color filters 50 may be separated from the grid patterns 40 by the partition patterns 60 and not be brought into contact with the grid patterns 40.

The top surfaces of the partition patterns 60 and the top surfaces of the color filters 50 may be substantially coplanar. For example, the partition patterns 60 and the color filters 50 may have substantially the same height (or vertical thickness).

The micro lenses 70 may have island shapes and be arranged in a matrix form having rows and columns in a top view. The micro lenses 70 may be isolated and separated from one another by the grid patterns 40 and the partition patterns 60.

Grooves 65 may be formed in the upper portions of the partition patterns 60. The lower ends of the grooves 65 may be positioned at a level lower than the top surfaces of the color filters 50. The micro lenses 70 may be further optically and physically separated from one another by the grooves 65. The flare prevention layers 80 may partially or completely fill the grooves 65. In some implementations, the flare prevention layers 80 may be physically continuous. In another embodiment, the flare prevention layers 80 may be physically separated by the grooves 65.

Figure 3F:
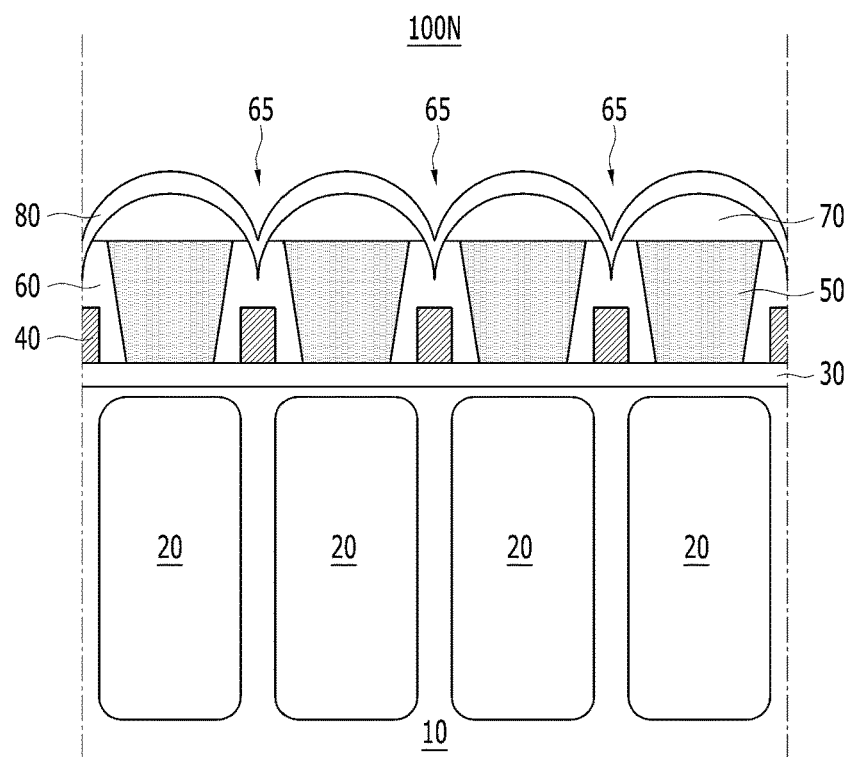

Referring to FIG. 3F, an image sensor 100N based on an embodiment may include partition patterns 60 which have inclined sidewalls, when compared to the image sensor 100M shown in FIG. 3E. The color filters 60 of the image sensor 100N may have inclined side surfaces.

Figure 3G:
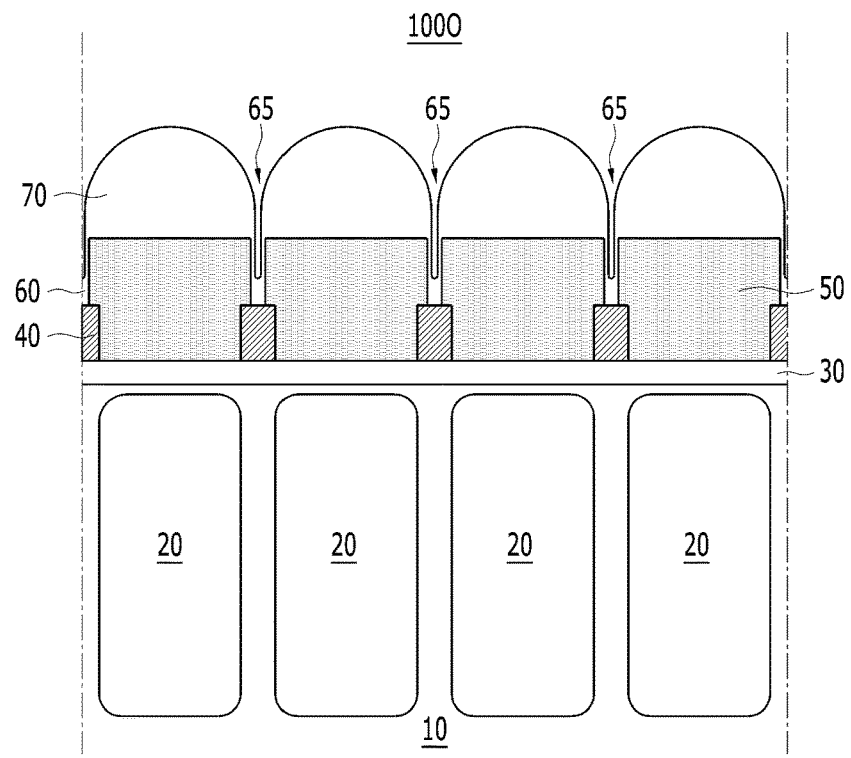

Referring to FIG. 3G, in an image sensor 100O based on an embodiment, when compared to the image sensor 100B shown in FIG. 2B, portions of color filters 50 may be formed on grid patterns 40. The color filters 50 may have different width in its upper portion and its lower portion. For example, the width of partition patterns 60 may be smaller than the width of the grid patterns 40. The width of each partition pattern 60 may be substantially same as or similar to a width of a space between the photodiodes 20.

Figure 3H:
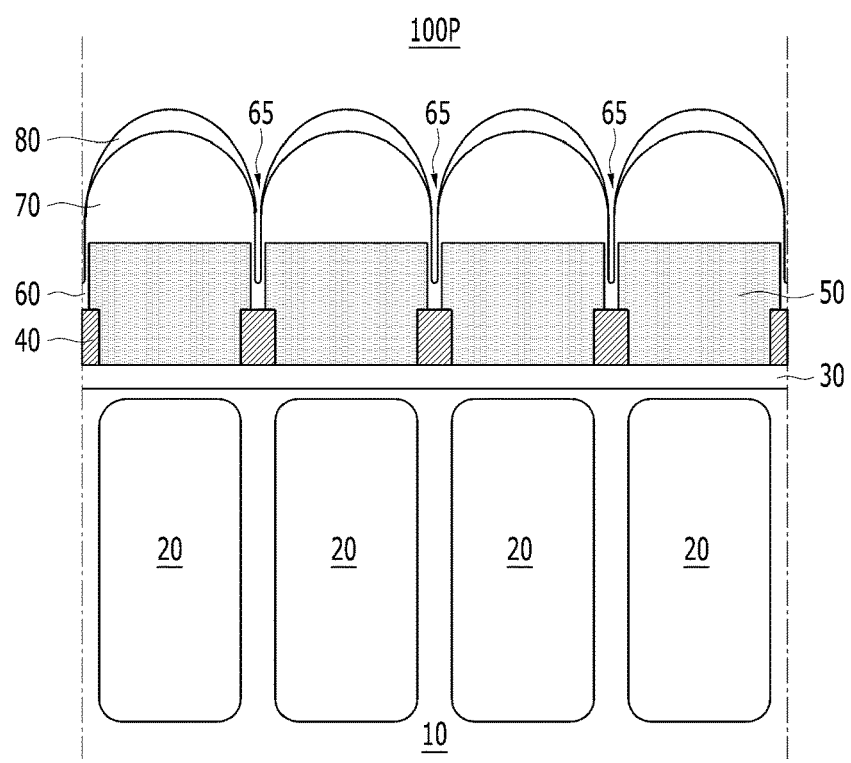

Referring to FIG. 3H, an image sensor 100P based on an embodiment may further include flare prevention layers 80, when compared to the image sensor 100O shown in FIG. 3G.

In the image sensors 100I to 100L, 100O and 100P shown in FIGS. 3A to 3D, 3G and 3H, the virtual boundary surfaces of the partition patterns 60 and the micro lenses 70 may be positioned at various levels. For example, in an embodiment, the virtual boundary surfaces of the partition patterns 60 and the micro lenses 70 may be positioned lower than the top surfaces of the color filters 50. In another embodiment, the virtual boundary surfaces of the partition patterns 60 and the micro lenses 70 may be substantially the same as or similar to the top surfaces of the color filters 50. In still another embodiment, the virtual boundary surfaces of the partition patterns 60 and the micro lenses 70 may be positioned at a level higher than the top surfaces of the color filters 50.

In the image sensors 100A to 100P based on the various embodiments, the specifications (e.g., horizontal widths, vertical thicknesses, heights and surface curvatures) of the grid patterns 40, the color filters 50, the partition patterns 60, the micro lenses 70, the flare prevention layers 80 and the grooves 65 may be changed and applied in a variety of ways.

FIGS. 4A to 4D are longitudinal sectional views to disclose a method for forming an image sensor based on an embodiment.

Figure 4A:
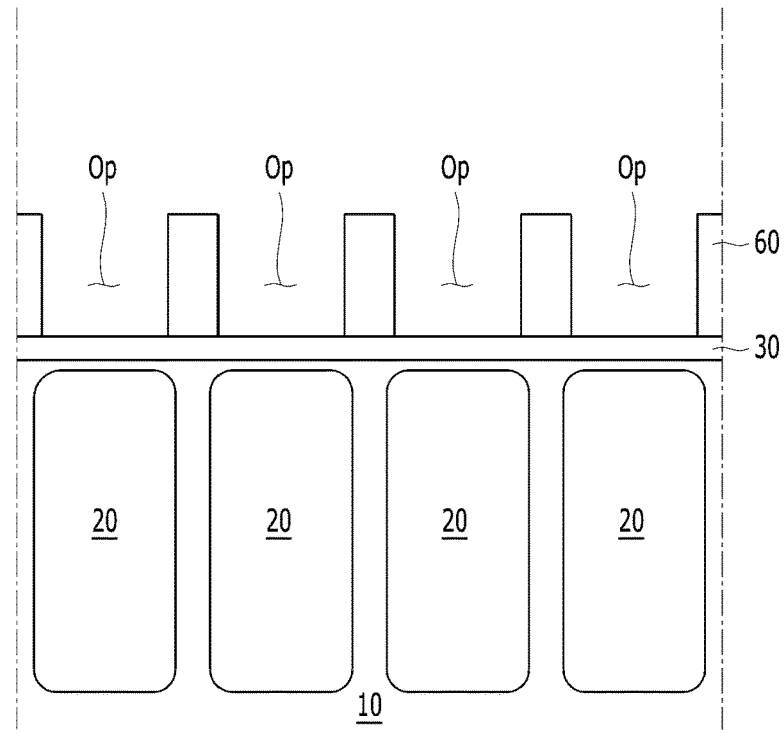
FIGS. 4A to 7D are examples of schematic longitudinal sectional views to show an exemplary method for forming an image sensor based on various embodiments of the disclosed technology.

Referring to FIG. 4A, the method for forming an image sensor based on the embodiment may include forming photodiodes 20 in a substrate 10, forming an antireflection layer 30 over the top surface of the substrate 10, and forming partition patterns 60 which have openings Op, over the antireflection layer 30.

The substrate 10 may include a single crystal silicon wafer, an SOI (silicon-on-insulator) wafer, or an epitaxially grown single crystal silicon layer.

The forming of the photodiodes 20 may include implanting N-type ions such as phosphorous (P) or arsenic (As) and/or P-type ions such as boron (B), by performing an ion implantation process.

The forming of the antireflection layer 30 may include forming a silicon nitride layer, a silicon oxide layer, or a silicon oxynitride layer as a single layer or a multilayer by performing a deposition process.

The forming of the partition patterns 60 may include forming a partition material layer on the antireflection layer 30 by performing a deposition process and pattering the partition material layer by performing a photolithography process and a patterning process. The forming of the partition material layer may include forming the layer including a polymeric material such as a polystyrene-based resin, a polyimide-based resin, a polysiloxane resin, an acrylic-based resin, an epoxy-based resin or a copolymer resin thereof or a silicon oxide-based or silicon nitride-based inorganic material having a flowability, and then, heating, drying and baking the layer. The openings Op may be vertically aligned with the photodiodes 20, and may expose the surface of the antireflection layer 30.

Figure 4B:
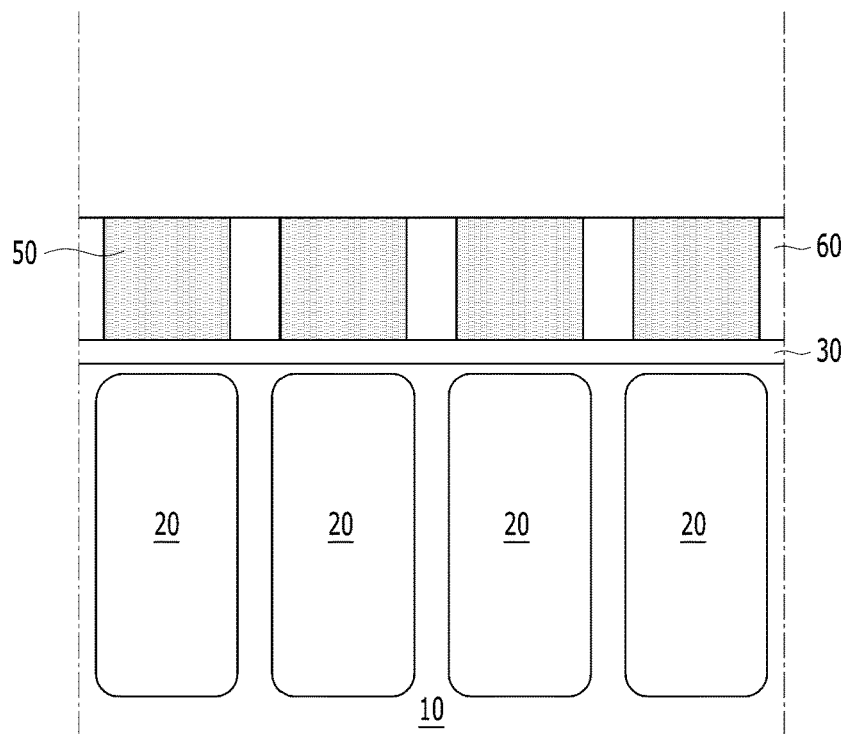

Referring to FIG. 4B, the method may include forming color filters 50 in the openings Op. The forming of the color filters 50 may include forming polymeric organic material patterns each including the pigment of red, green, or blue and a base resin, and heating and drying the polymeric organic material patterns.

Figure 4C:
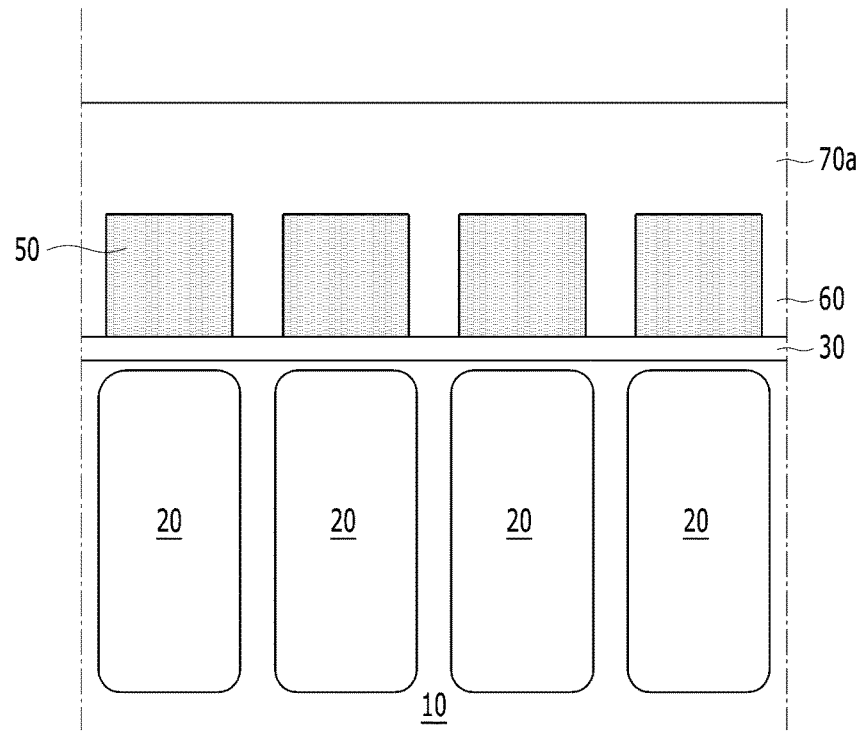

Referring to FIG. 4C, the method may include forming an overcoating layer 70a to cover the color filters 50 and the partition patterns 60. The forming of the overcoating layer 70a may include forming the layer including a polymeric material such as a polystyrene-based resin, a polyimide-based resin, a polysiloxane resin, an acrylic-based resin, an epoxy-based resin or a copolymer resin thereof or a silicon oxide-based or silicon nitride-based inorganic material having a flowability, and then, heating, drying and baking the layer. In the present embodiment, the partition patterns 60 and the overcoating layer 70a may include the same material. Therefore, the boundary surfaces between the partition patterns 60 and the overcoating layer 70a may not exist.

Figure 4D:
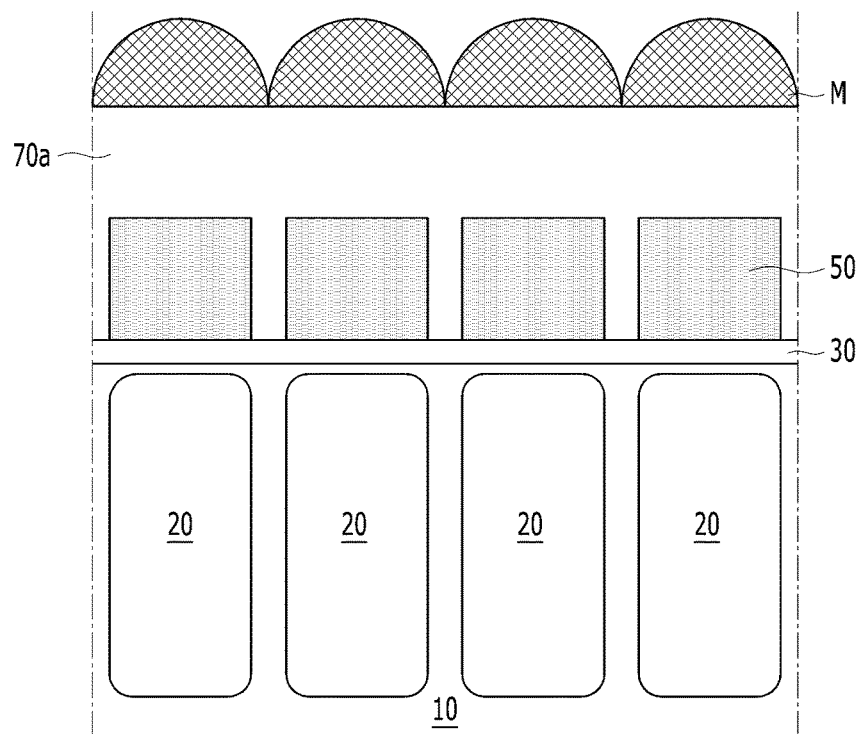

Referring to FIG. 4D, the method may include forming a mask pattern M over the overcoating layer 70a. The forming of the mask pattern M may include forming a polymeric organic material layer such as a photoresist by performing a photolithography process and heating and reflowing the polymeric organic material layer in hemispherical shapes.

Then, referring to FIG. 2A, the method may include removing the mask pattern M by performing an etch-back process and thereby forming micro lenses 70. The etch-back process may include both oxygen $O_2$ for removing the mask pattern M and an etch gas for etching the overcoating layer 70a. The etch gas may include $CF_4$ and $CHF_3$. For example, in the etch-back process, the overcoating layer 70a may be etched along the profile of the mask pattern M. Therefore, the micro lenses 70 may have a hemispherical shape like the mask pattern M. By the etch-back process, grooves 65 may be formed in the upper portions of the partition patterns 60. The lower ends of the grooves 65 may be recessed to be lower than the top surfaces of the color filters 50.

A method for forming an image sensor based on another embodiment may further include forming flare prevention layers 80 by referring to FIG. 2C after forming the micro lenses 70. The forming of the flare prevention layers 80 may include conformally forming a flare prevention material layer over the micro lenses 70 and then performing an etch-back process. By the etch-back process, the flare prevention layers 80 may be physically separated from one another.

FIGS. 5A to 5D are longitudinal sectional views to disclose a method for forming an image sensor based on an embodiment.

Figure 5A:
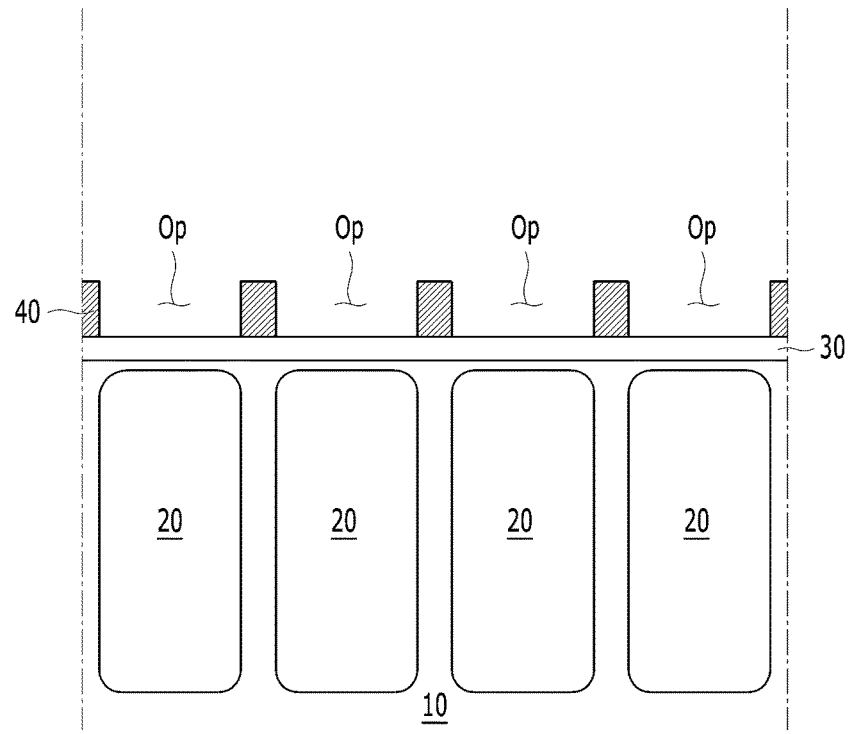

Referring to FIG. 5A, the method for forming an image sensor based on the embodiment may include forming photodiodes 20 in a substrate 10, forming an antireflection layer 30 over the first surface, for example, the top surface, of the substrate 10, and forming grid patterns 40 which have openings Op, over the antireflection layer 30.

The forming of the grid patterns 40 may include forming a grid material layer on the antireflection layer 30 by performing a deposition process and pattering the grid material layer by performing a photolithography process and a patterning process. The grid patterns 40 may include a metal such as tungsten (W). The grid patterns 40 may have the form of a mesh in a top view. The openings Op may be vertically aligned with the photodiodes 20, and may expose the surface of the antireflection layer 30.

Figure 5B:
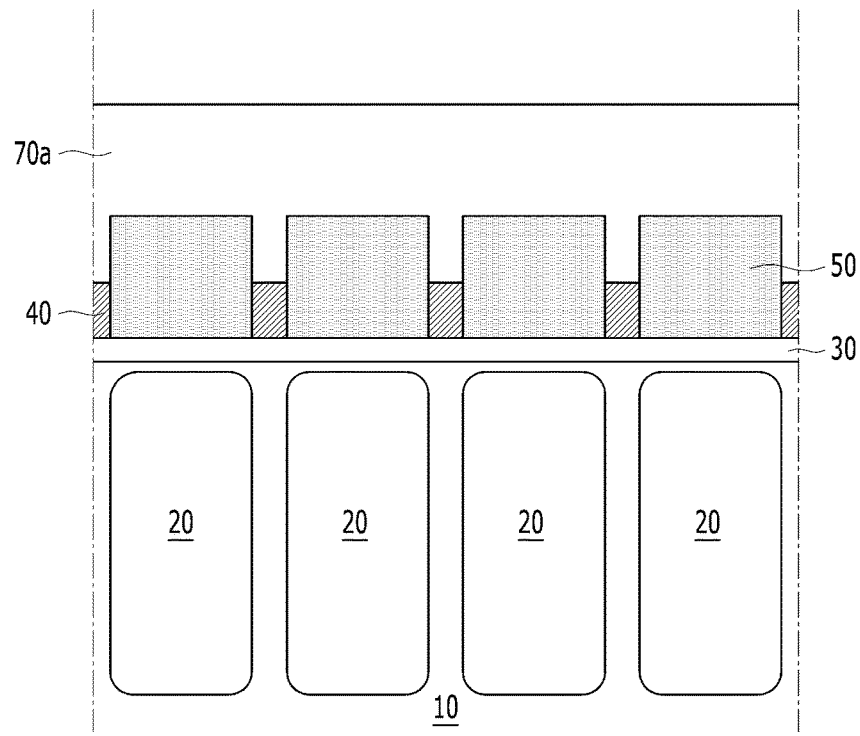

Referring to FIG. 5B, the method may include forming color filters 50 in the openings Op, and forming an overcoating layer 70a which covers the color filters 50.

Figure 5C:
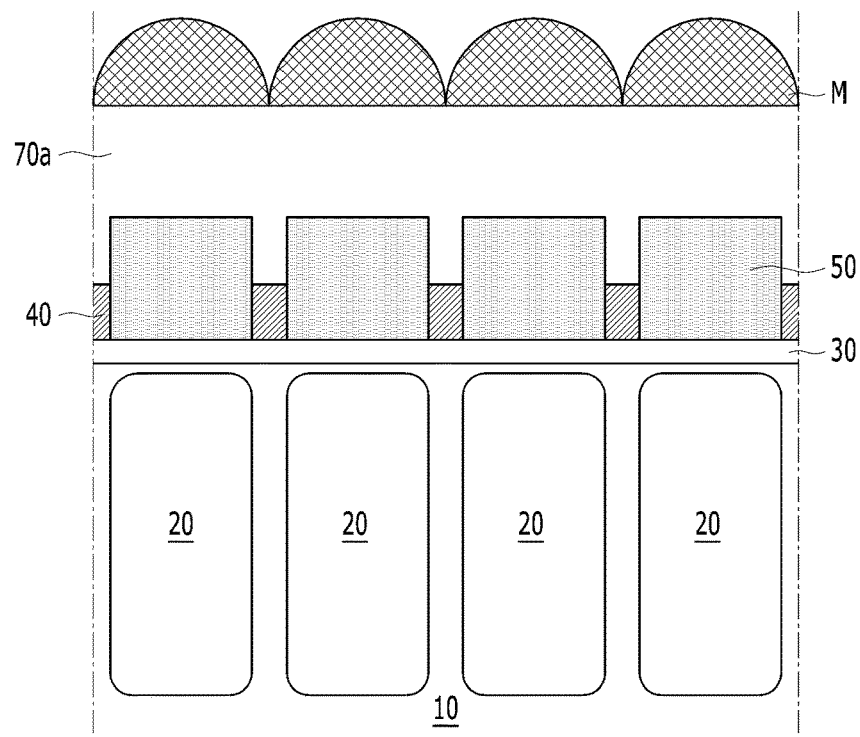

Referring to FIG. 5C, the method may include forming a mask pattern M on the overcoating layer 70a.

Figure 5D:
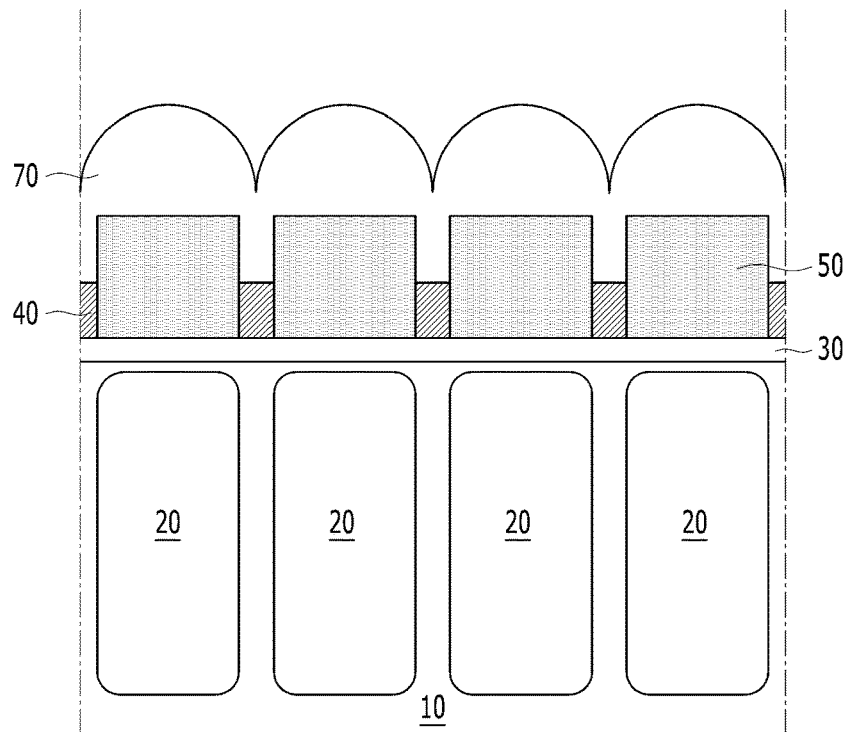

Referring to FIG. 5D, the method may include forming micro lenses 70 by performing an etch-back process. The micro lenses 70 may have a hemispherical shape like the mask pattern M.

Thereafter, referring to FIG. 2D or 2H, the method may include forming flare prevention layers 80 over the micro lenses 70. The forming of the flare prevention layers 80 may include forming a conformal oxide layer over the surfaces of the micro lenses 70 by performing a low temperature oxidation process or a low temperature oxide deposition process, and/or performing an etch-back process. For example, the thickness of the central portions of the flare prevention layers 80 may be thicker than the thickness of the outer portions thereof. The flare prevention layers 80 may increase or decrease a focal length in cooperation with the micro lenses 70. Therefore, the light concentration intensity of the image sensor may be increased or decreased, and thus, an image resolution according to the degree of integration of the pixels of the image sensor may be improved.

FIGS. 6A to 6D are longitudinal sectional views to disclose a method for forming an image sensor based on an embodiment.

Figure 6A:
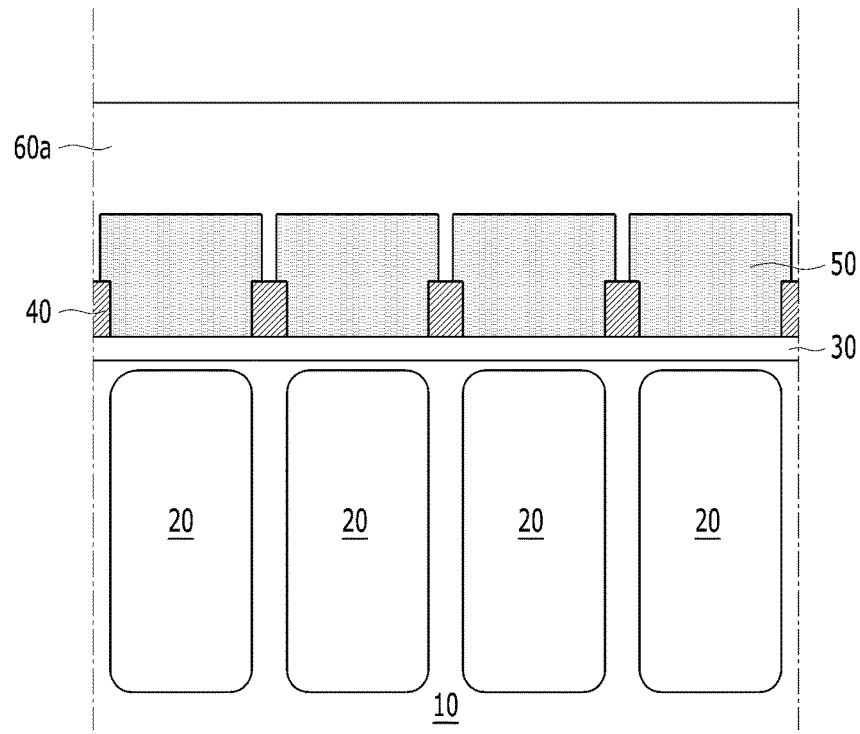

Referring to FIG. 6A, the method for forming an image sensor based on the embodiment may include forming photodiodes 20 in a substrate 10, forming an antireflection layer 30 over the first surface of the substrate 10, forming grid patterns 40 which have openings Op, over the antireflection layer 30, forming color filters 50 in the openings Op, and forming a partition material layer 60a which covers the color filters 50. The color filters 50 may be brought into direct contact with the grid patterns 40. The color filters 50 may partially vertically overlap with the grid patterns 40. The partition material layer 60a may include a photosensitive polymeric organic material, for example, a photosensitive polyimide. In another embodiment, the partition material layer 60a may include a non-photosensitive polymeric organic material or an inorganic material such as a silicon oxide.

Figure 6B:
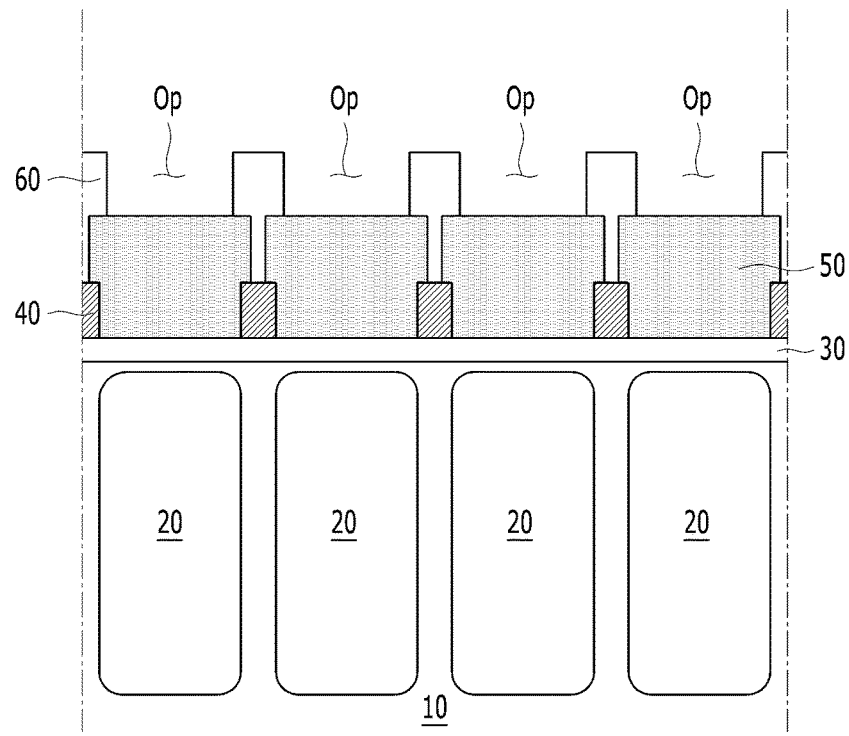

Referring to FIG. 6B, the method may include forming partition patterns 60 which have openings Op exposing the top surfaces of the color filters 50, by performing a photolithography process and an etching process. In a top view, the partition patterns 60 may have the mesh form which overlaps with or is disposed over the grid patterns 40.

Figure 6C:
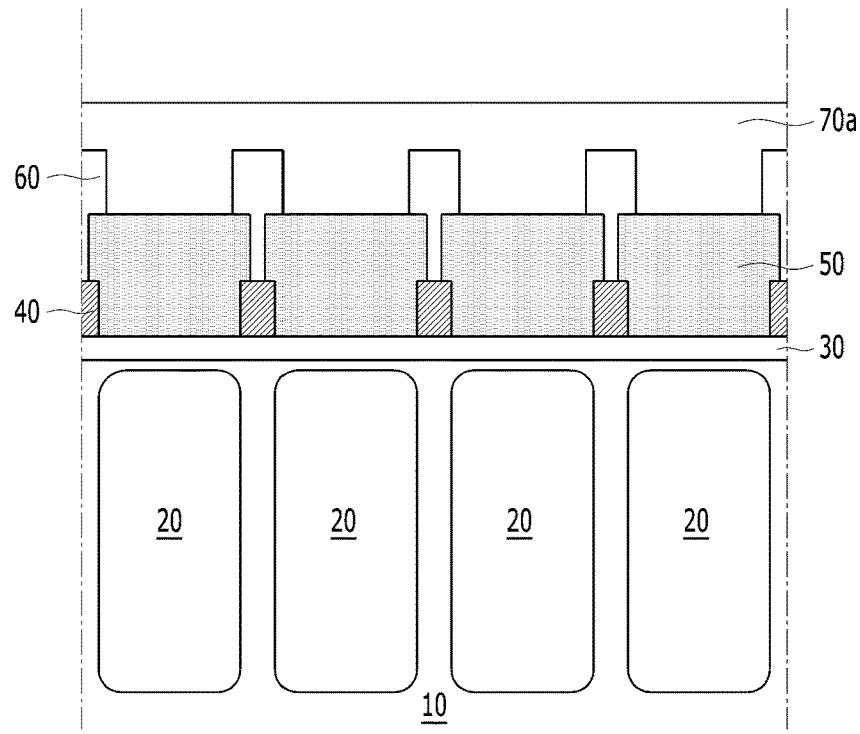

Referring to FIG. 6C, the method may include forming an overcoating layer 70a which fills the openings Op and covers the partition patterns 60.

Figure 6D:
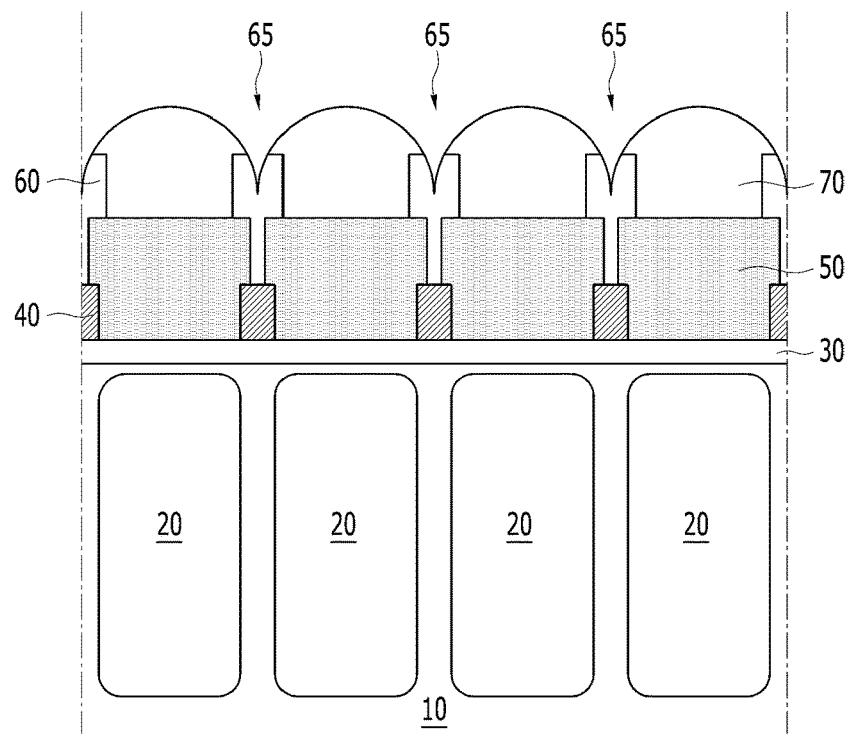

Referring to FIG. 6D, the method may include forming a hemispherical mask pattern M on the overcoating layer 70a by referring to FIG. 5C, and forming micro lenses 70 by performing an etch-back process. In this process, as the upper portions of the partition patterns 60 are partially removed, grooves 65 may be formed.

Thereafter, the method may include forming flare prevention layers 80 on the micro lenses 70.

A method for forming an image sensor in accordance with another embodiment may include etching the sidewalls of the partition patterns 60 to be inclined.

FIGS. 7A to 7D are longitudinal sectional views to disclose a method for forming an image sensor based on an embodiment.

Figure 7A:
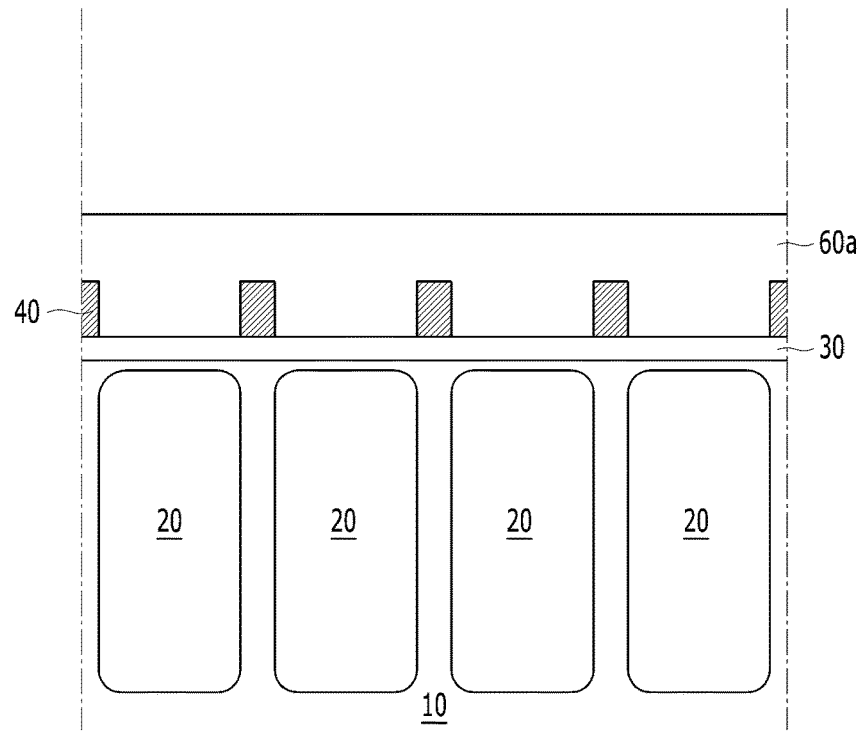

Referring to FIG. 7A, the method for forming an image sensor in accordance with the embodiment may include forming photodiodes 20 in a substrate 10, forming an antireflection layer 30 over the top surface of the substrate 10, forming grid patterns 40 over the antireflection layer 30, and forming a partition material layer 60a which covers the exposed antireflection layer 30 and the grid patterns 40. The partition material layer 60a may have a refractive index lower than the color filters 50. For example, the partition material layer 60a may include a silicon oxide which has a refractive index of about 1.3 or less.

Figure 7B:
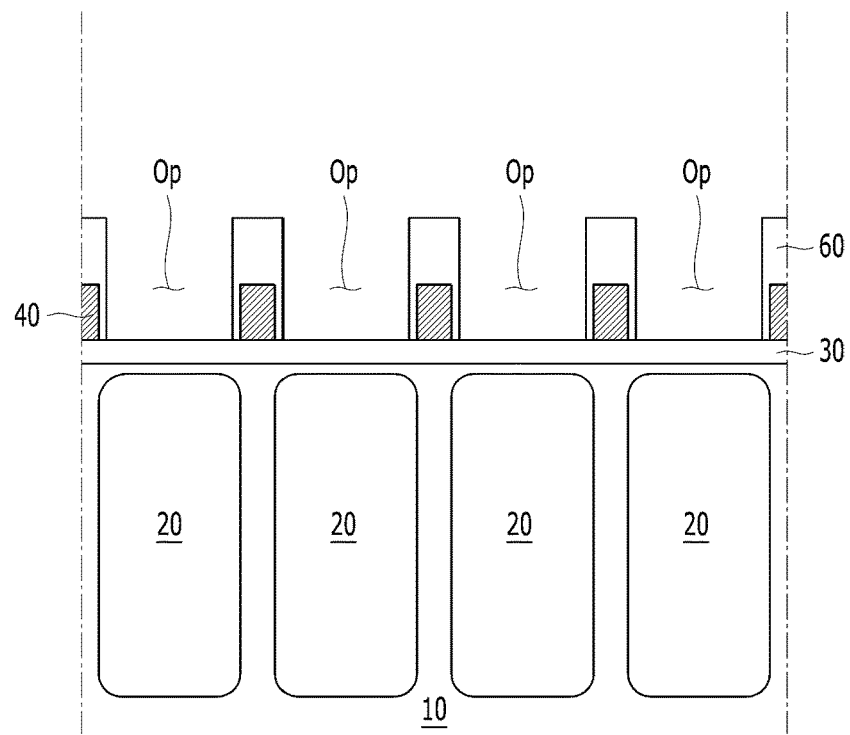

Referring to FIG. 7B, the method may include patterning the partition material layer 60a by performing a photolithography process and an etching process. The partition material layer 60a may be patterned into partition patterns 60. The partition patterns 60 may completely cover and surround the grid patterns 40. For example, each of the partition patterns 60 may have a horizontal width wider than that of the grid pattern and a vertical thickness (or height) higher than that of the grid pattern 40. The partition patterns 60 and the grid patterns 40 may be arranged in the mesh forms and the partition patterns 60 and the grid patterns 50 may completely overlap in a top view. The partition patterns 60 may define openings Op which selectively expose the top surface of the antireflection layer 30. The openings Op may be vertically aligned with the photodiodes 20.

Figure 7C:
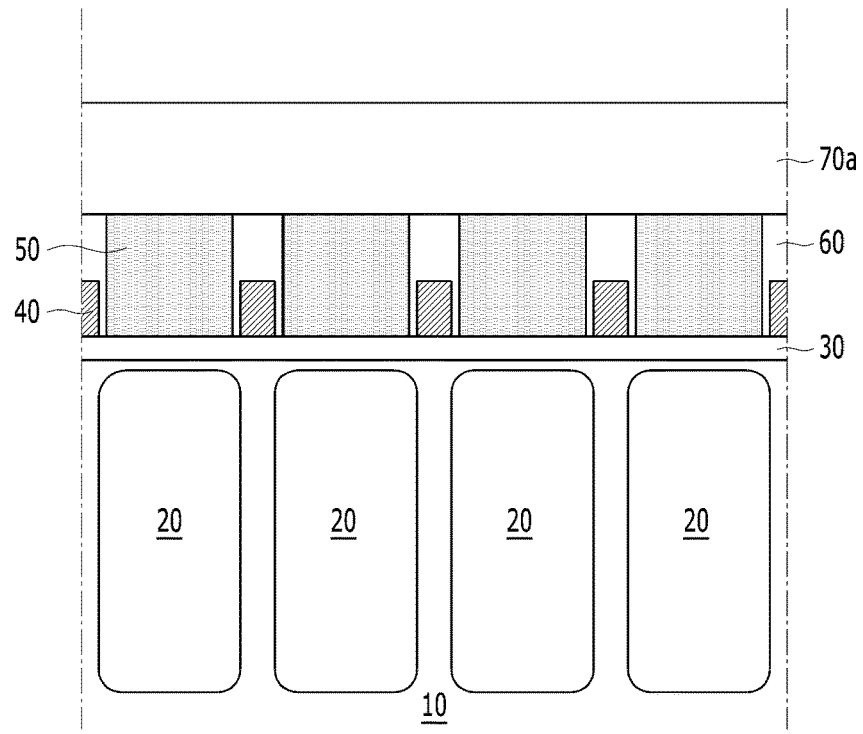

Referring to FIG. 7C, the method may include forming color filters 50 in the openings Op which are defined by the partition patterns 60, and forming an overcoating layer 70a over the color filters 50 and the partition patterns 60. The top surfaces of the color filters 50 and the top surfaces of the partition patterns 60 may be coplanar. In another embodiment, the top surfaces of the color filters 50 may be positioned at a level different from the top surfaces of the partition patterns 60. The overcoating layer 70a may have a refractive index higher than the partition patterns 60. For example, the overcoating layer 70a may include a polymeric organic material or an inorganic material such as a silicon oxide, which has a refractive index of about 1.56 or over. In the present embodiment, the overcoating layer 70a may include a silicon oxide.

Figure 7D:
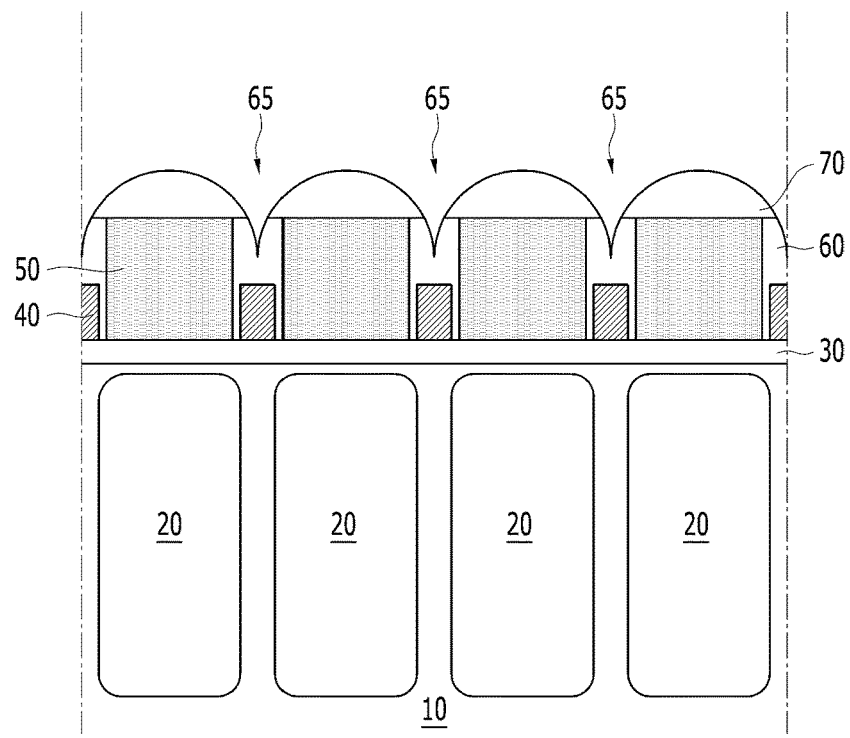

Referring to FIG. 7D, the method may include forming a hemispherical mask pattern M over the overcoating layer 70a by referring to FIG. 5C, and forming micro lenses 70 by performing an etch-back process. In this process, as the upper portions of the partition patterns 60 are partially removed, grooves 65 may be formed.

Thereafter, the method may include forming flare prevention layers 80 over the micro lenses 70.

A method for forming an image sensor in accordance with another embodiment may include etching the sidewalls of the partition patterns 60 to be inclined.

Figure 8:
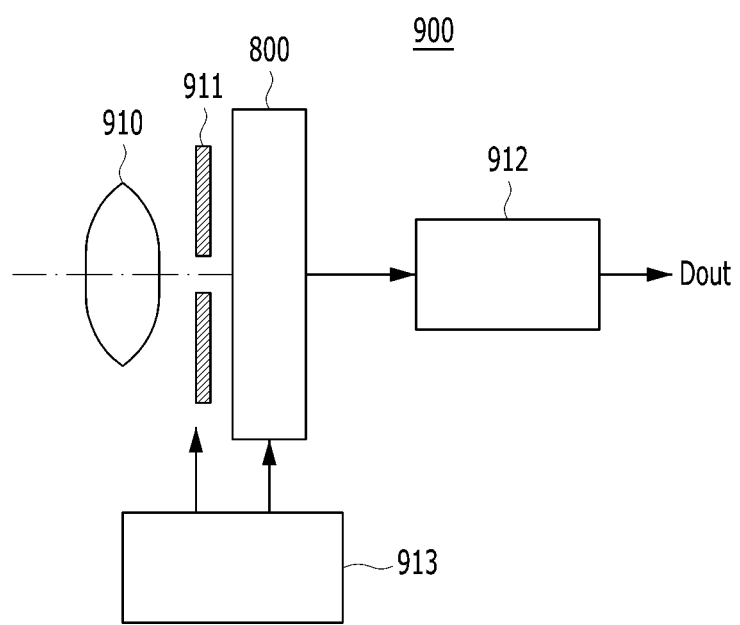
FIG. 8 is an example of a schematic diagram illustrating an electronic device including an image sensor based on various embodiments of the disclosed technology.

FIG. 8 is a diagram schematically illustrating an electronic device 900 including one of the image sensors based on the various embodiments.

Referring to FIG. 8, the electronic device 900 including at least one of the image sensors based on the embodiments may include a camera capable of photographing a still image or a moving image. The electronic device 900 may include an optical system (or optical lens) 910, a shutter unit 911, a driving unit 913 for controlling/driving an image sensor 800 and the shutter unit 911, and a signal processing unit 912. The image sensor 800 may include one of the image sensors 100A to 100P according to the various embodiments.

The optical system 910 may guide image light (incident light) from an object, to a pixel array (see the reference numeral 810 of FIG. 1) of the image sensor 800. The optical system 910 may include a plurality of optical lenses. The shutter unit 911 may control a light irradiation period and a light shielding period for the image sensor 800. The driving circuit 913 may control the transmission operation of the image sensor 800 and the shutter operation of the shutter unit 911. The signal processing unit 912 performs various kinds of signal processing for the signal outputted from the image sensor 800. An image signal Dout after signal processing may be stored in a storage medium such as a memory or may be outputted to a monitor or the like.

Although various embodiments have been described for illustrative purposes, it will be apparent to those skilled in the art that various changes and modifications may be made without departing from the spirit and scope of the invention as defined in the following claims.

What is claimed is:
1. An image sensor comprising:
   a substrate;
   photo-sensing elements formed in the substrate, each photo-sensing element responsive to light to produce a photo-sensing electrical signal;
   an antireflection layer formed over of the photo-sensing elements and structured to reduce optical reflection to facilitate optical transmission of incident light to the photo-sensing elements through the antireflection layer;
   color filters formed over the antireflection layer and arranged to spatially correspond to the photo-sensing elements, respectively, each color filter structured to select a designated color in the incident light to transmit through to a corresponding photo-sensing element;
   partition patterns formed over the antireflection layer and arranged to spatially correspond to the photo-sensing elements, respectively, to partition light receiving area above the photo-sensing elements into separate light receiving areas, each partition pattern surrounding a corresponding color filter to be separate from an adjacent color filter;

grooves formed in upper portions of the partition patterns, and providing air gaps splitting the upper portions of the partition patterns; and micro lenses formed over the partition patterns and the color filters to direct incident light to the photo-sensing elements through the color filters, respectively, wherein the micro lenses are separated from one another by the air gaps, wherein lower ends of the air gaps are lower than top surfaces of the color filters.

2. The image sensor according to claim 1, wherein the partition patterns and the grooves are arranged in a mesh form which overlap with each other in a top view.

3. The image sensor according to claim 1, further comprising:

flare prevention layers conformally formed on surfaces of the micro lenses to reduce flare and extended to fill the grooves.

4. The image sensor according to claim 1, wherein the partition patterns include a polymeric organic material or an inorganic material which has a refractive index lower than the color filters.

5. The image sensor according to claim 1, wherein the micro lenses have a refractive index lower than the color filters.

6. The image sensor according to claim 1, wherein the partition patterns have a refractive index lower than the micro lenses.

7. The image sensor according to claim 1, wherein the partition patterns and the micro lenses include a same material.

8. The image sensor according to claim 1, wherein top surfaces of the partition patterns are positioned at a level higher than top surfaces of the color filters.

9. The image sensor according to claim 1, further comprising:

grid patterns disposed between the antireflection layer and the partition patterns, wherein the grid patterns include a metal.

10. The image sensor according to claim 9, wherein the grid patterns, the partition patterns and the grooves are arranged in a mesh form which overlap with one another in a top view.

11. The image sensor according to claim 9, wherein the partition patterns have a horizontal width greater than that of the grid patterns to surround side surfaces of the grid patterns.

12. The image sensor according to claim 1, wherein the partition patterns include lower portions which have a relatively small horizontal width and upper portions which have a relatively large horizontal width.

13. The image sensor according to claim 12, wherein the width of the lower portions of the partition patterns is smaller than a width of the grid patterns.

\* \* \* \* \*